United States Patent
Kaneko

(10) Patent No.: US 8,724,368 B2
(45) Date of Patent: May 13, 2014

(54) METHOD FOR DRIVING SEMICONDUCTOR MEMORY DEVICE

(71) Applicant: Panasonic Corporation, Osaka (JP)

(72) Inventor: Yukihiro Kaneko, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/692,587

(22) Filed: Dec. 3, 2012

(65) Prior Publication Data

US 2013/0094274 A1    Apr. 18, 2013

Related U.S. Application Data

(63) Continuation of application No. PCT/JP2012/001190, filed on Feb. 22, 2012.

(30) Foreign Application Priority Data

Jul. 15, 2011 (JP) ................... 2011-156405

(51) Int. Cl.
*G11C 11/22* (2006.01)

(52) U.S. Cl.
USPC ... 365/145; 365/49.13; 365/148; 365/210.12; 257/295; 257/E27.104

(58) Field of Classification Search
USPC .......... 365/145, 49.13, 148, 210.12; 257/295, 257/E27.104
See application file for complete search history.

(56) References Cited

U.S. PATENT DOCUMENTS

| | | | |
|---|---|---|---|
| 6,532,165 B1 | 3/2003 | Katori | |
| 7,187,575 B2 * | 3/2007 | Kijima et al. | 365/145 |
| 7,842,989 B2 * | 11/2010 | Kato | 257/295 |
| 8,004,871 B2 * | 8/2011 | Kaneko et al. | 365/145 |
| 8,228,708 B2 * | 7/2012 | Kaneko et al. | 365/145 |
| 8,385,099 B2 * | 2/2013 | Kaneko et al. | 365/145 |
| 2006/0138520 A1 | 6/2006 | Kang et al. | |
| 2008/0237695 A1 | 10/2008 | Shino et al. | |
| 2009/0097299 A1 | 4/2009 | Tanaka et al. | |
| 2009/0173978 A1 | 7/2009 | Kato | |

FOREIGN PATENT DOCUMENTS

| | | |
|---|---|---|
| JP | 2000-340759 A | 12/2000 |
| JP | 2003-163331 A | 6/2003 |
| JP | 2006-190933 A | 7/2006 |
| JP | 2008-091492 A | 4/2008 |
| JP | 2008-263019 A | 10/2008 |
| JP | 2008-270313 A | 11/2008 |

(Continued)

OTHER PUBLICATIONS

International Search Report issued in International Patent Application No. PCT/JP2012/001190 dated May 22, 2012.

*Primary Examiner* — Toan Le
(74) *Attorney, Agent, or Firm* — McDermott Will & Emery LLP

(57) ABSTRACT

A semiconductor device includes first to fourth memory cells and each memory cell includes a first gate electrode, a ferroelectric film, a semiconductor film, a source electrode, a drain electrode, a paraelectric film and a second gate electrode. The ferroelectric film is interposed between the first gate electrode and the semiconductor film, the source electrode and the drain electrode are interposed between the semiconductor film and the paraelectric film. The first gate electrode, the ferroelectric film, the source electrode, and the drain electrode constitute a first semiconductor transistor. The second gate electrode, the paraelectric film, the source electrode, and the drain electrode constitute a second semiconductor transistor.

6 Claims, 18 Drawing Sheets

(56) References Cited

FOREIGN PATENT DOCUMENTS

| | | |
|---|---|---|
| JP | 2009-099606 A | 5/2009 |
| JP | 2009-164473 A | 7/2009 |
| WO | WO-2010/097862 A1 | 9/2010 |

\* cited by examiner

METHOD FOR DRIVING SEMICONDUCTOR MEMORY DEVICE

This is a continuation of International Application No. PCT/JP2012/001190, with an international filing date of Feb. 22, 2012, which claims priority of Japanese Patent Application No. 2011-156405, filed on Jul. 15, 2011, the contents of which are hereby incorporated by reference.

TECHNICAL FIELD

The present invention relates to a method for driving a semiconductor memory device.

BACKGROUND ART

Patent Literature 1 discloses a semiconductor memory device. The semiconductor memory device comprises plural memory cells 20 disposed in a matrix form. More particularly, see FIG. 1 and FIG. 19 of Patent Literature 1.

FIG. 17 and FIG. 18 show reproductions of FIG. 1(a) and FIG. 19(a) of Patent Literature 1, respectively. As shown in FIG. 17, the memory cell 20 includes a substrate 11, a first gate electrode 12, a ferroelectric film 13, a semiconductor film 14, a source electrode 15s, a drain electrode 15d, a paraelectric film 16, a second gate electrode 17. As shown in FIG. 18, plural memory cells 20 are disposed in a matrix form.

Japanese Laid-pen Patent Application No. 2009-099606 corresponds to US Pre-Grant Patent Application Publication No. 2009/0097299.

CITATION LIST

Patent Literature

[Patent Literature 1]
WO2010/097862
[Patent Literature 2]
Japanese Laid-Open Patent Application No. 2009-099606

SUMMARY OF INVENTION

Technical Problem

An object of the present invention is to provide a novel method for driving a semiconductor memory device.

Solution to Problem

A method for driving a semiconductor memory device, the method comprising steps of:
a step (a) of preparing the semiconductor memory device; wherein
the semiconductor memory device comprises:
at least two bit lines (BL);
at least two word lines (WL); and
at least four memory cells (5) disposed at intersections of each bit line (BL) and each word line (WL); wherein
the at least two bit lines (BL) include a first bit line (BL1) and a second bit line (BL2);
the at least two word lines (WL) include a first word line (WL1) and a second word line (WL2);
the at least four memory cells (5) include first to fourth memory cells (51, 52, 53, 54);
each memory cell (51, 52, 53, 54) comprises:
a first gate electrode (12);
a ferroelectric film (13);
a semiconductor film (14);
a source electrode (15s);
a drain electrode (15d);
a paraelectric film (16); and
a second gate electrode (17);
the ferroelectric film (13) is interposed between the first gate electrode (12) and the semiconductor film (14);
the source electrode (15s) and the drain electrode (15d) are interposed between the semiconductor film (14) and the paraelectric film (16),
the first gate electrode (12), the ferroelectric film (13), the source electrode (15s), and the drain electrode (15d) constitute a first semiconductor transistor (18);
the second gate electrode (17), the paraelectric film (16), the source electrode (15s), and the drain electrode (15d) constitute a second semiconductor transistor (19);
the first word line (WL1) comprises a first top gate word line (WTG1) and a first bottom gate word line (WGB1);
the second word line (WL2) comprises a second top gate word line (WTG2) and a second bottom gate word line (WGB2);
the first top gate word line (WTG1) is electrically connected to the second gate electrodes (17) of the first and second memory cells (51, 52);
the first bottom gate word line (WBG1) is electrically connected to the first gate electrodes (12) of the first and second memory cells (51, 52);
the second top gate word line (WTG2) is electrically connected to the second gate electrodes (17) of the third and fourth memory cells (53, 54);
the second bottom gate word line (WBG2) is electrically connected to the first gate electrodes (12) of the third and fourth memory cells (53, 54);
the first bit line (BL1) is electrically connected to the drain electrode (15d) of the first memory cell (51);
the source electrode (15s) of the first memory cell (51) is electrically connected to the drain electrode (15d) of the third memory cell (53);
the second bit line (BL2) is electrically connected to the drain electrode (15d) of the second memory cell (52);
the source electrode (15s) of the second memory cell (52) is electrically connected to the drain electrode (15d) of the fourth memory cell (54);
each of the first to third memory cells (51 to 53) has either a low resistance state or a high resistance state; and
the fourth memory cell (54) has the high resistance state;
a step (b) of applying voltages BL1V, BL2V, WBG1V, and WBG2V which satisfy the following relationship from time tB to time tC, while an ON voltage is applied to the first top gate word line (WTG1) and to the second top gate word line (WTG2), after the step (a), so as to maintain the states of the first to fourth memory cells (51 to 54);

BL1V>BL2V

WBG1V<BL1V

WBG2V<BL1V

WBG1V=BL2V, and

WBG2V=BL2V where

BL1V represents a voltage applied to the first bit line (BL1);

BL2V represents a voltage applied to the second bit line (BL2);

WTG1V represents a voltage applied to the first top gate word line (WTG1);

WBG1V represents a voltage applied to the first bottom gate word line (WBG1); and WTG2V represents a voltage applied to the second top gate word line (WTG1); and WBG2V represents a voltage applied to the second bottom gate word line (WBG2);

a step (c) of applying voltages BL1V, BL2V, WBG1V, and WBG2V which satisfy the following relationship from the time tC to time tD, while an ON voltage is applied to the first top gate word line (WTG1) and to the second top gate word line (WTG2), after the step (b), so as to maintain the states of the first to third memory cells (51 to 53), however, so as to vary the state of the fourth memory cell (54) from the high resistance state to the low resistance state; and

BL1V>BL2V

WBG1V<BL1V

WBG2V=BL1V

WBG1V=BL2V, and

WBG2V>BL2V a step (d) of applying voltages BL1V, BL2V, WBG1V, and WBG2V which satisfy the following relationship from the time tD to time tE, while an ON voltage is applied to the first top gate word line (WTG1) and to the second top gate word line (WTG2), after the step (c), so as to maintain the states of the first to fourth memory cells (51 to 54);

BL1V>BL2V

WBG1V<BL1V

WBG2V<BL1V

WBG1V=BL2V, and

WBG2V=BL2V wherein an inequality set: t1<tD−tC<tE−tB<t2 is satisfied;

where t1 represents time necessary for the memory cell to vary from the high resistance state to the low resistance state; and t2 represents time necessary for the memory cell to vary from the low resistance state to the high resistance state.

Advantageous Effects of Invention

The present invention provides a novel method for driving a semiconductor memory device.

DESCRIPTION OF EMBODIMENTS

Figure 1A:
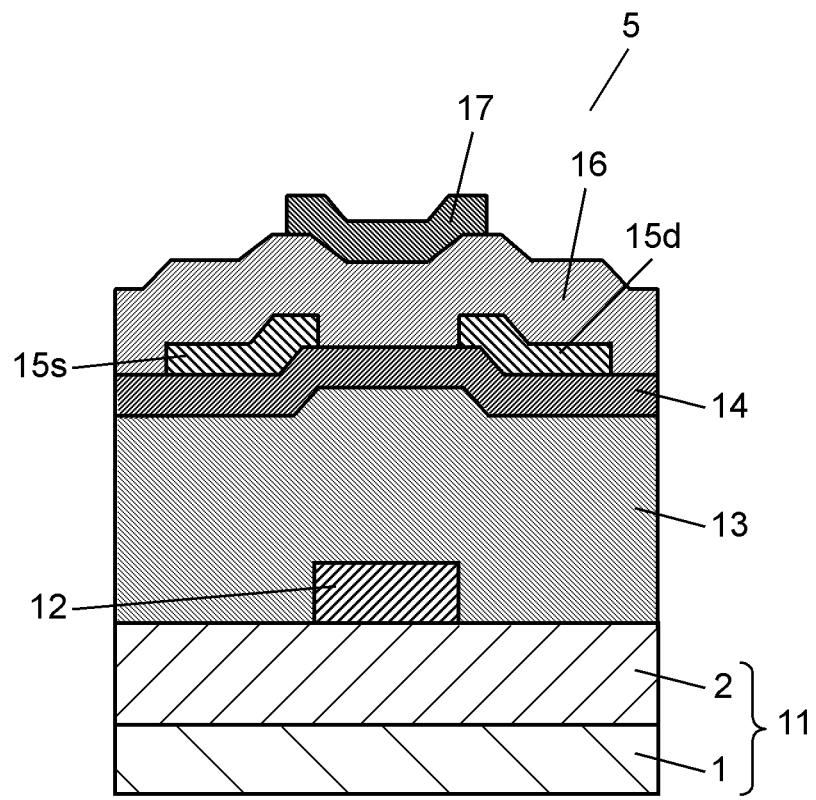
FIG. 1A shows a cross-sectional view of a memory cell 5.

Hereinafter, embodiments of the present invention will be described. In the following description, the same components are designated by the same reference numerals, and hence repetitive description is omitted.

FIG. 1A shows a cross-sectional view of a memory cell 5. As shown in FIG. 1A, the memory cell 5 includes a first gate electrode 12, a ferroelectric film 13, a semiconductor film 14, a source electrode 15s, a drain electrode 15d, a paraelectric film 16, a second gate electrode 17.

The memory cell 5 is preferably formed on a substrate 11. It is preferable that the substrate 11 is a silicon substrate 1 comprising a silicon oxide film 2 on its surface.

The ferroelectric film 13 is interposed between the first gate electrode 12 and the semiconductor film 14. Preferably, the ferroelectric film 13 is in contact with the semiconductor film 14.

The source electrode 15s and the drain electrode 15d are interposed between the semiconductor film 14 and the paraelectric film 16.

Figure 1B:
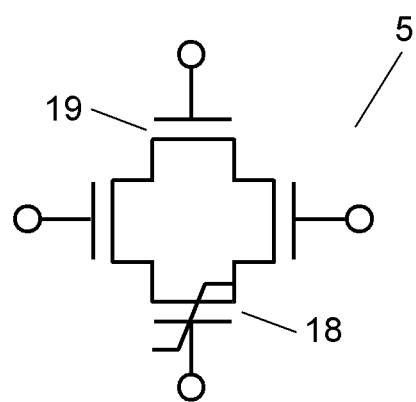
FIG. 1B shows an equivalent circuit diagram of the memory cell 5 shown in FIG. 1A.

FIG. 1B shows an equivalent circuit diagram of the memory cell 5 shown in FIG. 1A.

The first gate electrode 12, the ferroelectric film 13, the source electrode 15s, and the drain electrode 15d constitute a first semiconductor transistor 18. This first semiconductor transistor 18 is nonvolatile due to the ferroelectric film 13.

The second gate electrode 17, the paraelectric film 16, the source electrode 15s, and the drain electrode 15d constitute a second semiconductor transistor 19. This second semiconductor transistor 19 is volatile due to the paraelectric film 16.

Here, the terms "low resistance state" and "high resistance state" are described in more detail.

In the low resistance state, the state of the first semiconductor transistor 18 of the memory cell 5 is the ON state, and the state of the second semiconductor transistor 19 is also the ON state. In this state, the current flows from the drain electrode 15d to the source electrode 15s through the first semiconductor transistor 18 and the second semiconductor transistor 19.

In the high resistance state, the state of the first semiconductor transistor 18 of the memory cell 5 is an OFF state, whereas the state of the second semiconductor transistor 19 is the ON state. In this state, the current flows from the drain electrode 15d to the source electrode 15s only through the second semiconductor transistor 19.

When the state of the first semiconductor transistor 18 of the memory cell 5 is an OFF state, and when the state of the second semiconductor transistor 19 is also the OFF state, the memory cell 5 has a much higher resistance value than the memory cell having the high resistance state. The high resistance state may include the state where the memory cell 5 has such a much higher resistance value.

As described above, the memory cell 5 has either a low resistance state or a high resistance state.

Figure 2:
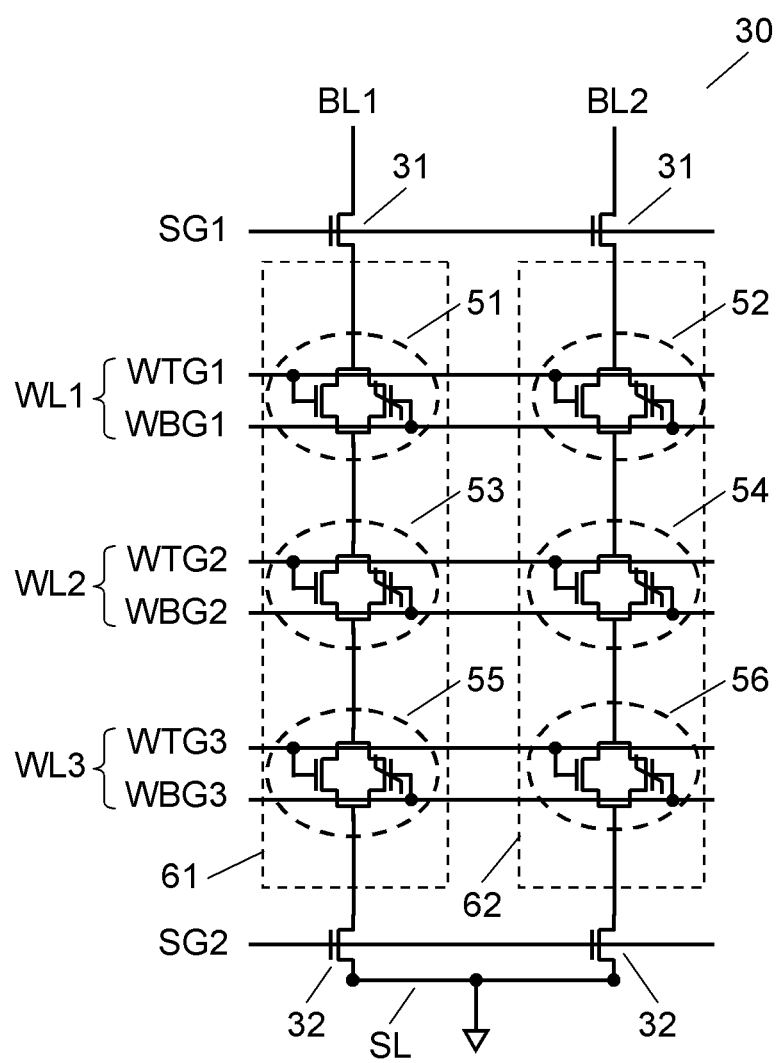
FIG. 2 shows a circuit diagram of the semiconductor memory device 30.

As shown in FIG. 2, the semiconductor memory device 30 comprises plural bit lines BLs and plural word lines WLs. In other words, the semiconductor memory device 30 comprises at least two bit lines BLs and at least two word lines WLs. Each bit line BL is at right angles to each word line WL.

The memory cell 5 is placed on an intersection point where each bit line BL and each word line WL intersect. Accordingly, the semiconductor memory device 30 comprises at least four memory cells including first to fourth memory cells 51 to 54.

In FIG. 2, a first bit line BL1, a second bit line BL2, a first word line WL1, a second word line WL2 and a third word line WL3 are illustrated. The first to six memory cells 51 to 56 are disposed.

Each word line WL comprises a top gate word line WTG and a bottom gate word line WBG. Each top gate word line WTG is electrically connected to the second gate electrode 17. Each bottom gate word line WBG is electrically connected to the first gate electrode 12.

More particularly, as shown in FIG. 2, the first word line WL1 comprises a first top gate word line WTG1 and a first bottom gate word line WBG1. The first top gate word line WTG1 is electrically connected to the second gate electrodes 17 of the first memory cell 51 and the second memory cell 52. The first bottom gate word line WBG1 is electrically connected to the first gate electrodes 12 of the first memory cell 51 and the second memory cell 52. Similarly, the second word line WL2 comprises a second top gate word line WTG2 and a second bottom gate word line WBG2. The second top gate word line WTG2 is electrically connected to the second gate electrodes 17 of the third memory cell 53 and the fourth memory cell 54. The second bottom gate word line WBG2 is electrically connected to the first gate electrodes 12 of the third memory cell 53 and the fourth memory cell 54.

Plural memory cells 5 aligned along the bit line BL form one cell column 6. More particularly, as shown in FIG. 2, a first cell column 61 includes the first memory cell 51, the third memory cell 53, and the fifth memory cell 55. Similarly, a second cell column 62 includes the second memory cell 52, the fourth memory cell 54, and the sixth memory cell 56.

In one cell column 6, the drain electrode 15d of each memory cell 5 is electrically connected to the source electrode 15s of the adjacent memory cell 5, except for the drain electrode 15d of the memory cell 5 located in the one end. More specifically, the source electrode 15s of the first memory cell 51 is electrically connected to the drain electrode 15d of the third memory cell 53. The source electrode 15s of the third memory cell 53 is electrically connected to the drain electrode 15d of the fifth memory cell 55. Similarly, the source electrode 15s of the second memory cell 52 is electrically connected to the drain electrode 15d of the fourth memory cell 54. The source electrode 15s of the fourth memory cell 54 is electrically connected to the drain electrode 15d of the sixth memory cell 56.

It is preferable that the semiconductor memory device 30 further comprises plural first select transistors 31 and plural second select transistors 32. Each first select transistor 31 is provided between each bit line BL and one end of each cell column 6 so as to be electrically connected thereto. All the first select transistors 31 turn into the ON state by applying the ON voltage (e.g., 10 volts) to a first select gate line SG1. Each second select transistor 32 is provided between the other end of each cell column 6 and a source line SL so as to be electrically connected thereto. It is preferable that the source line SL be grounded. All the second select transistors 32 turn into the ON state by applying the ON voltage (e.g., 10 volts) to a second select gate line SG2.

In one cell column 6, the drain electrode 15d of the memory cell 5 located in the one end is electrically connected to the bit line BL through the first select transistor 31. The source electrode 15s of the memory cell 5 located in the other end is electrically connected to the source line SL through the second select transistor 32.

Figure 3A:
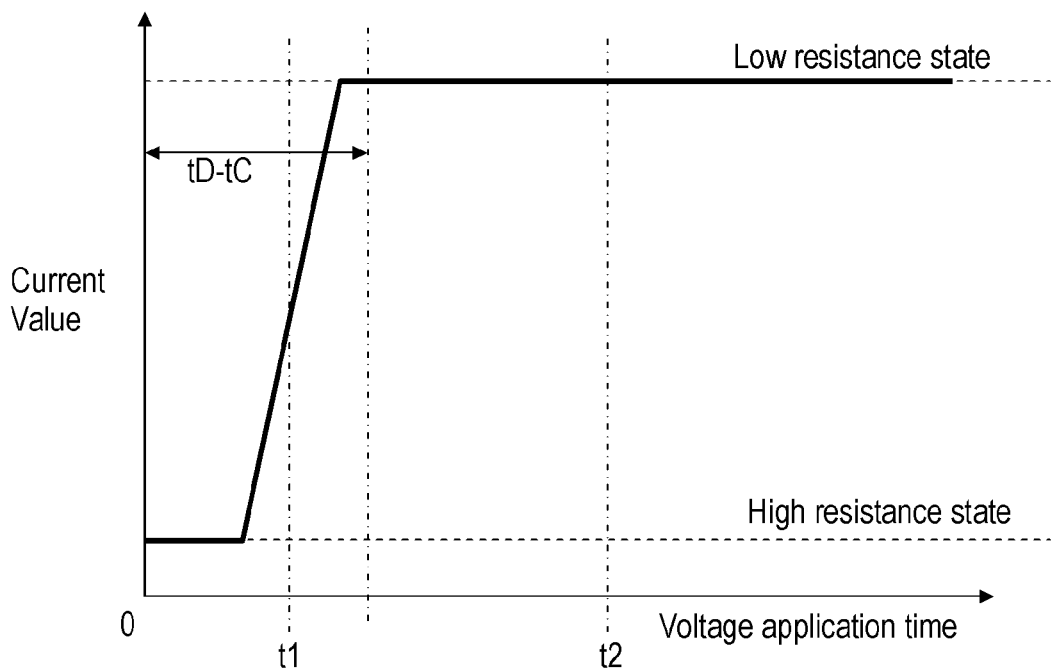
FIG. 3A is a graph showing the relationship between the bottom gate word line WBG and the current value flowing through the memory cell 5, when the state of the memory cell 5 is varied from the high resistance state to the low resistance state.
Figure 3B:
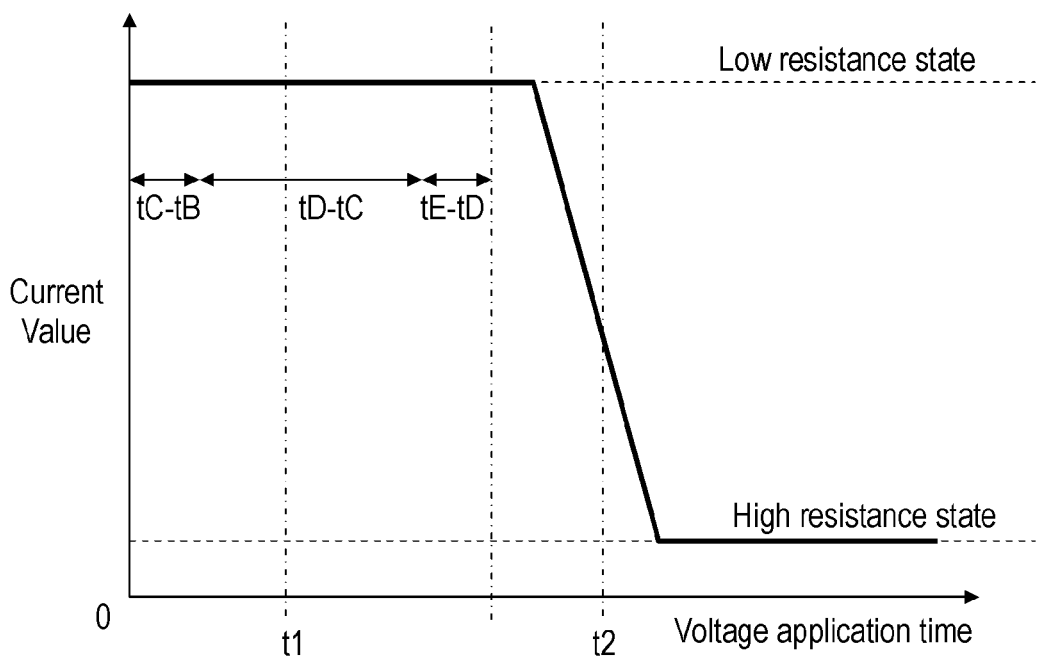
FIG. 3B is a graph showing the relationship between the bottom gate word line WBG and the current value flowing through the memory cell 5, when the state of the memory cell 5 is varied from the low resistance state to the high resistance state.

The present inventor has discovered that the memory cell 5 has the following property as shown in FIG. 3A and FIG. 3B:

$$t1 < t2$$

where t1 represents time necessary for varying the state of the memory cell 5 from the high resistance state to the low resistance state by applying the ON voltage (e.g., 10 volts) to the first gate electrode 12 (see FIG. 3A), and t2 represents time necessary for varying the state of the memory cell 5 from the low resistance state to the high resistance state by applying the OFF voltage (e.g., 0 volts) to the first gate electrode 12 (see FIG. 3B).

The present invention is provided by taking the advantage of this property. This property is described in more detail in the example, which is described later.

(Step (a))

First, the above-mentioned semiconductor memory device 30 is prepared.

And then, an ON voltage (e.g., 10 volts) is applied to the first select gate line SG1. In this way, each bit line BL is electrically connected to the drain electrode 15d of the memory cell 5 located in the one end of each cell column 6. Furthermore, an ON voltage (e.g., 10 volts) is applied to each top gate word line WTG so as to connect each source electrode 15s of the memory cells 5 included in each cell column 6 to the drain electrode 15d of the adjacent memory cell 5. In other words, the states of all the second semiconductor transistors 19, each of which is volatile, included in each cell column 6 turn into the ON state. An OFF voltage (e.g., 0 volts) is applied to the second select gate line SG2.

Figure 5:
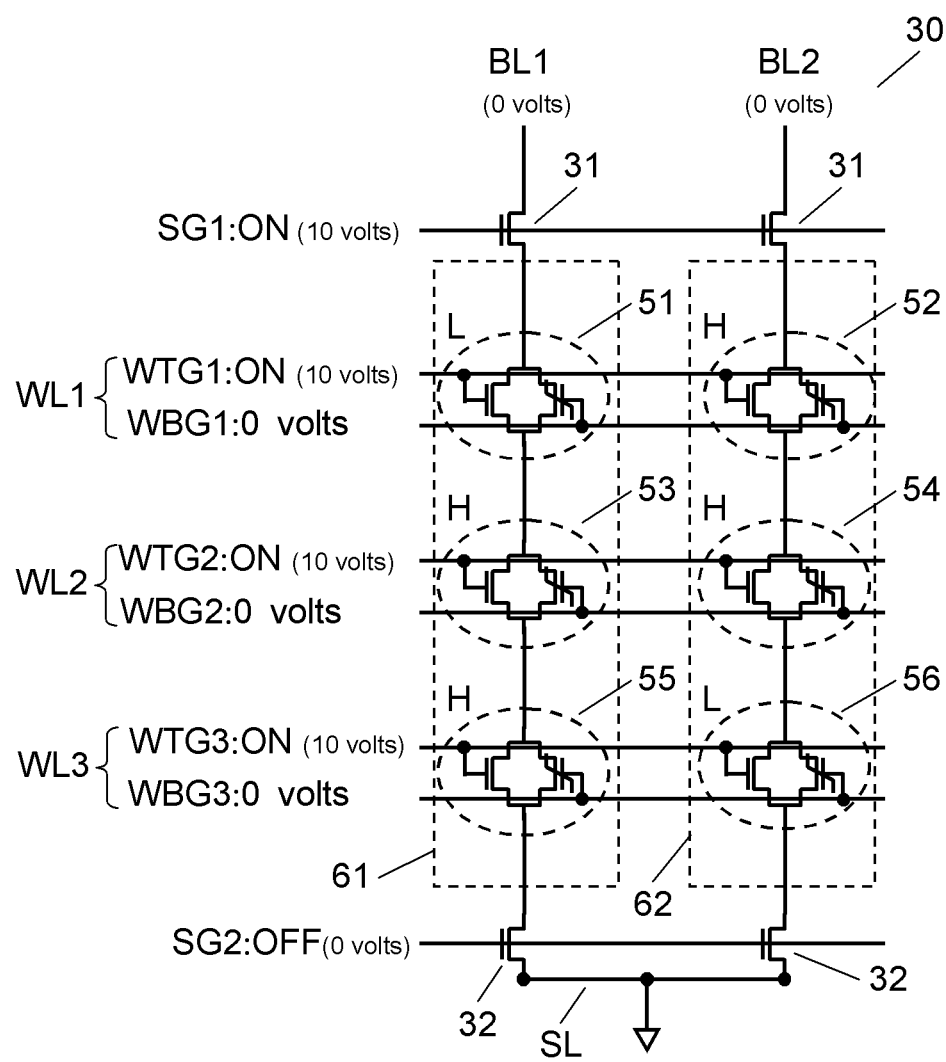
FIG. 5 shows the state in the step (a).

More particularly, as shown in FIG. 5, the ON voltage (e.g., 10 volts) is applied to first select gate line SG1 so as to electrically connect the drain electrode 15d of the first memory cell 51 and the drain electrode 15d of the second memory cell 52 to the first bit line BL1 and the second bit line BL2, respectively.

Furthermore, the ON voltage (e.g., 10 volts) is applied to each of the first top gate word line WTG1, the second top gate word line WTG2, and the third top gate word line WTG3. In this way, the state of each second semiconductor transistor 19 of the first to six memory cells 51 to 56 turns to the ON state.

On the other hand, a voltage of 0 volts is applied to the first bottom gate word line WBG1, the second bottom gate word line WBG2, and the third bottom gate word line WBG3. The state of each first semiconductor transistor 18 of the first to six memory cells 51 to 56 remains in the OFF state.

The first to third memory cells 51 to 53 each have either the low resistance states or the high resistance states.

The fourth memory cell has the high resistance state.

The fifth and sixth memory cells 55 and 56 each have the low resistance states or the high resistance states.

In order to facilitate understanding of the description, in the following description, it is assumed that the steps (b) to (d) have been performed with regard to the first memory cell 51 and that the first memory cell 51 has the low resistance state. Furthermore, it is assumed that the sixth memory cell 56 has the low resistance state through the performance of the steps (b) to (d). It is assumed that other memory cells 52, 53, and 55 have the high resistance state each.

In FIG. 5, a character "L" described in the upper left corner of the each memory cell 5 means the low resistance state. Similarly, a character "H" means the high resistance state.

When the bottom gate word line WBG has a higher voltage than the bit line BL, the state of the memory cell 5 rapidly varies from the high resistance state to the low resistance state as shown in FIG. 3A. The time t1 is required to rapidly vary the state of the memory cell 5 from the high resistance state to the low resistance state.

On the other hand, when the bottom gate word line WBG has a lower voltage than the bit line BL, the state of memory cell 5 slowly varies from the low resistance state to the high resistance state as shown FIG. 3B. The time t2 is required to slowly vary the state of the memory cell 5 from the low resistance state to the high resistance state.

The relationship: time t1<time t2 is satisfied.

When the voltage of the bottom gate word line WBG is equal to the voltage of bit line BL, the state of the memory cell 5 is not varied. In FIG. 5, all the voltages of the bottom gate word lines WBG are equal to all the voltages of the bit lines BL (all 0 volts). Therefore, in FIG. 5, the states of the first to sixth memory cells 51 to 56 are not varied.

(Step (b))

After the step (a), the step (b) is performed.

The step (b) is performed from time tB to time tC.

Figure 6:
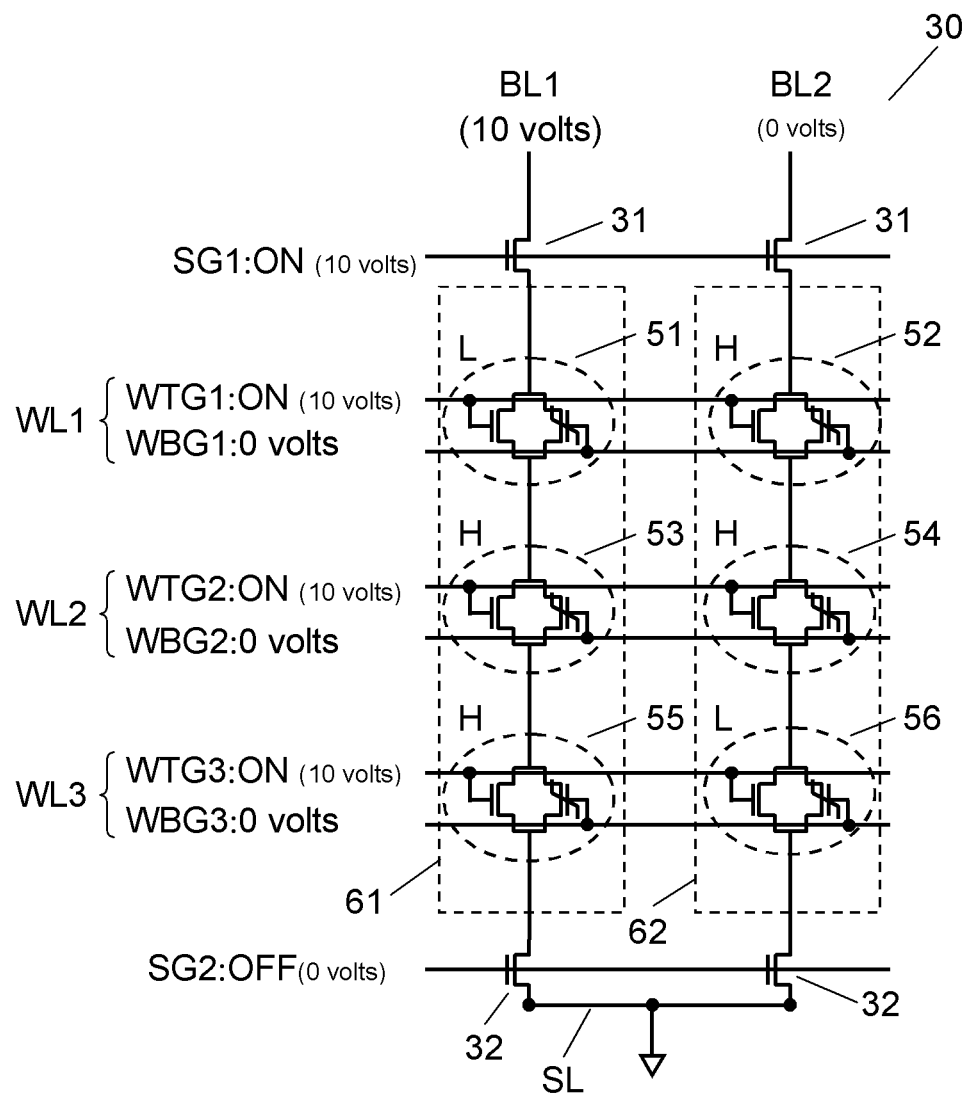
FIG. 6 shows the state in the step (b).

In the step (b), as shown in FIG. 6, the voltage applied to the first bit line BL1 is increased. In FIG. 6, the voltage increases from 0 volts to 10 volts.

In the step (b), the following relationships are satisfied:

BL1V (e.g., 10 volts in FIG. 6)>BL2V (e.g., 0 volts in FIG. 6),

WBG1V (e.g., 0 volts in FIG. 6)<BL1V (e.g., 10 volts in FIG. 6),

WBG2V (e.g., 0 volts in FIG. 6)<BL1V (e.g., 10 volts in FIG. 6),

WBG1V (e.g., 0 volts in FIG. 6)=BL2V (e.g., 0 volts in FIG. 6), and

WBG2V (e.g., 0 volts in FIG. 6)=BL2V (e.g., 0 volts in FIG. 6), where

BL1V represents the voltage applied to the first bit line BL1,

BL2V represents the voltage applied to the second bit line BL2,

WBG1 represents the voltage applied to the first bottom gate word line WBG1, and WBG2 represents the voltage applied to the first bottom gate word line WBG2.

It is remained that the ON voltage (e.g., 10 volts) is applied to each top gate word line WTG.

Since the relationship: WBG1V (e.g., 0 volts in FIG. 6)<BL1V (e.g., 10 volts in FIG. 6) is satisfied, the state of first memory cell 51 is going to vary slowly from the low resistance state to the high resistance state as shown in FIG. 3B. However, as shown in FIG. 3B, the period: (tC−tB) of the step (b) is shorter than the time t2. Accordingly, the state of the first memory cell 51 is remained in the low resistance state.

Since the relationship (II): WBG2V (e.g., 0 volts in FIG. 6)<BL1V (e.g., 10 volts in FIG. 6) is satisfied, the state of the third memory cell 53 is remained in the high resistance state. Similarly, the state of the fifth memory cell 55 is also remained in the high resistance state.

Since the relationship: WBG1V (e.g., 0 volts in FIG. 6)=BL2V (e.g., 0 volts in FIG. 6) is satisfied, the state of the second memory cell 52 is not varied (here, remained in the high resistance state).

Similarly, the relationship: WBG2V (e.g., 0 volts in FIG. 6)=BL2V (e.g., 0 volts in FIG. 6) is satisfied, the states of the fourth memory cell 54 and the sixth memory cell 56 are not varied (here, remained in the high resistance state and the low resistance state, respectively).

(Step (c))

After the step (b), the step (c) is performed.

The step (c) is performed from the time tC to time tD.

Figure 7:
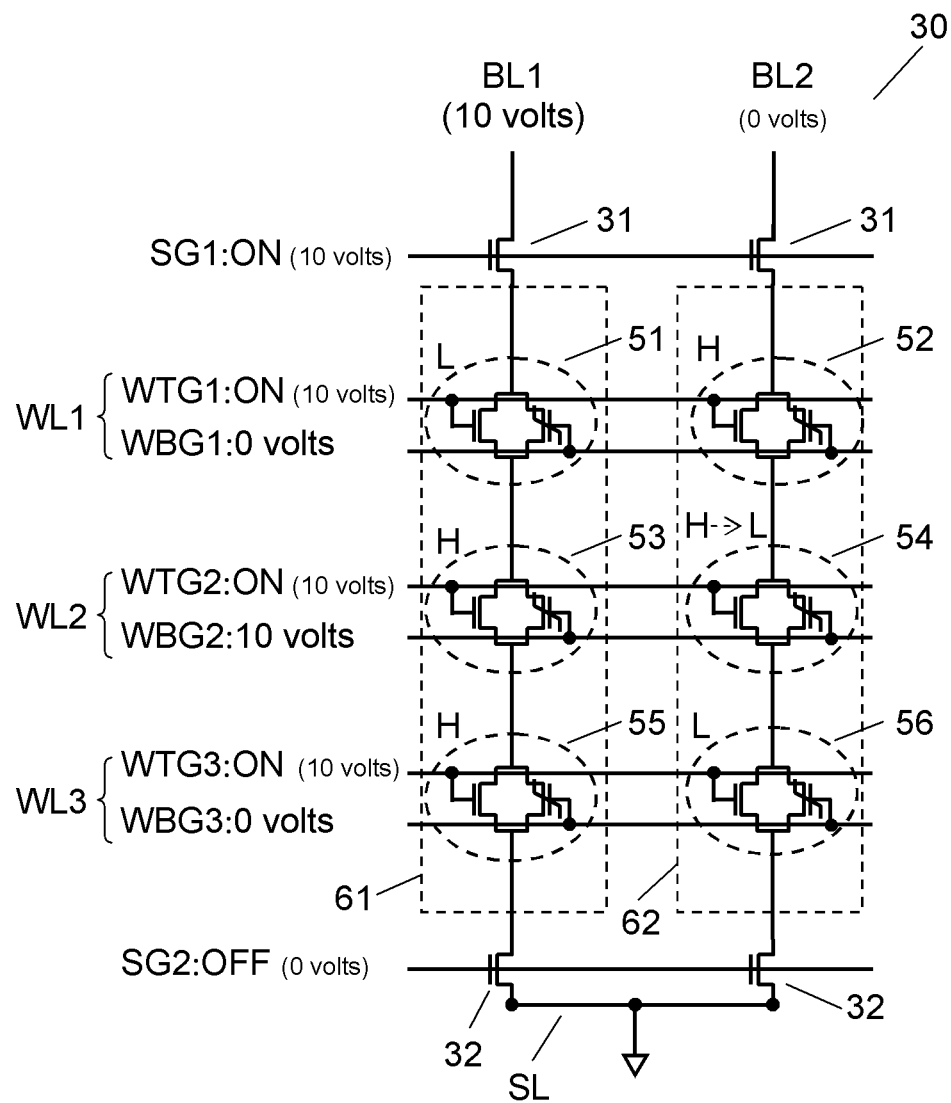
FIG. 7 shows the state in the step (c).

In the step (c), as shown in FIG. 7, the voltage applied to the second bottom gate word line WBG2 is increased. In FIG. 7, the voltage increases from 0 volts to 10 volts.

In the step (c), the following relationships are satisfied:

BL1V (e.g., 10 volts in FIG. 7)>BL2V (e.g., 0 volts in FIG. 7),

WBG1V (e.g., 0 volts in FIG. 7)<BL1V (e.g., 10 volts in FIG. 7),

WBG2V (e.g., 10 volts in FIG. 7)=BL1V (e.g., 10 volts in FIG. 7),

WBG1V (e.g., 0 volts in FIG. 7)=BL2V (e.g., 0 volts in FIG. 7), and

WBG2V (e.g., 10 volts in FIG. 7)>BL2V (e.g., 0 volts in FIG. 7).

It is remained that the ON voltage (e.g., 10 volts) is applied to each top gate word line WTG.

Similarly to the case of the step (b), since the relationship: WBG1V (e.g., 0 volts in FIG. 7)<BL1V (e.g., 10 volts in FIG. 7) is satisfied, the state of the first memory cell 51 is going to vary moderately from the low resistance state to the high resistance state as shown in FIG. 3B. However, as shown in FIG. 3B, the period: (tD−tB) of the steps (b) and (c) is shorter than the time t2. Accordingly, the state of the first memory cell 51 is remained in the low resistance state.

Since the relationship: WBG2V (e.g., 10 volts in FIG. 7)=BL1V (e.g., 10 volts in FIG. 7) is satisfied, the state of the third memory cell 53 is not varied (in FIG. 7, remained in the high resistance state). With regard to the fifth memory cell 55, since the state of the step (b) is the same as the state of the step (c), the state of the fifth memory cell 55 is remained in the high resistance state.

Since the relationship: WBG1V (e.g., 0 volts in FIG. 7)=BL2V (e.g., 0 volts in FIG. 7) is satisfied, the state of the second memory cell 52 is not varied (here, remained in the high resistance state). Similarly, the state of the sixth memory cell 56 is not varied.

Unlike the case of FIG. 6, the relationship: WBG2V (e.g., 10 volts in FIG. 7)>BL2V (e.g., 0 volts in FIG. 7) is satisfied, the state of the fourth memory cell 54 rapidly varies from the high resistance state to the low resistance state as shown in FIG. 3A. Here, as shown in FIG. 3A, the period: (tD−tC) of the step (c) is longer than the time t1. In case where the period: (tD−tC) of the step (c) is shorter than the time t1, the state of the fourth memory cell 54 fails to vary from the high resistance state to the low resistance state.

(Step (d))

After the step (c), the step (d) is performed.

The step (d) is performed from the time tD to time tE.

Figure 8:
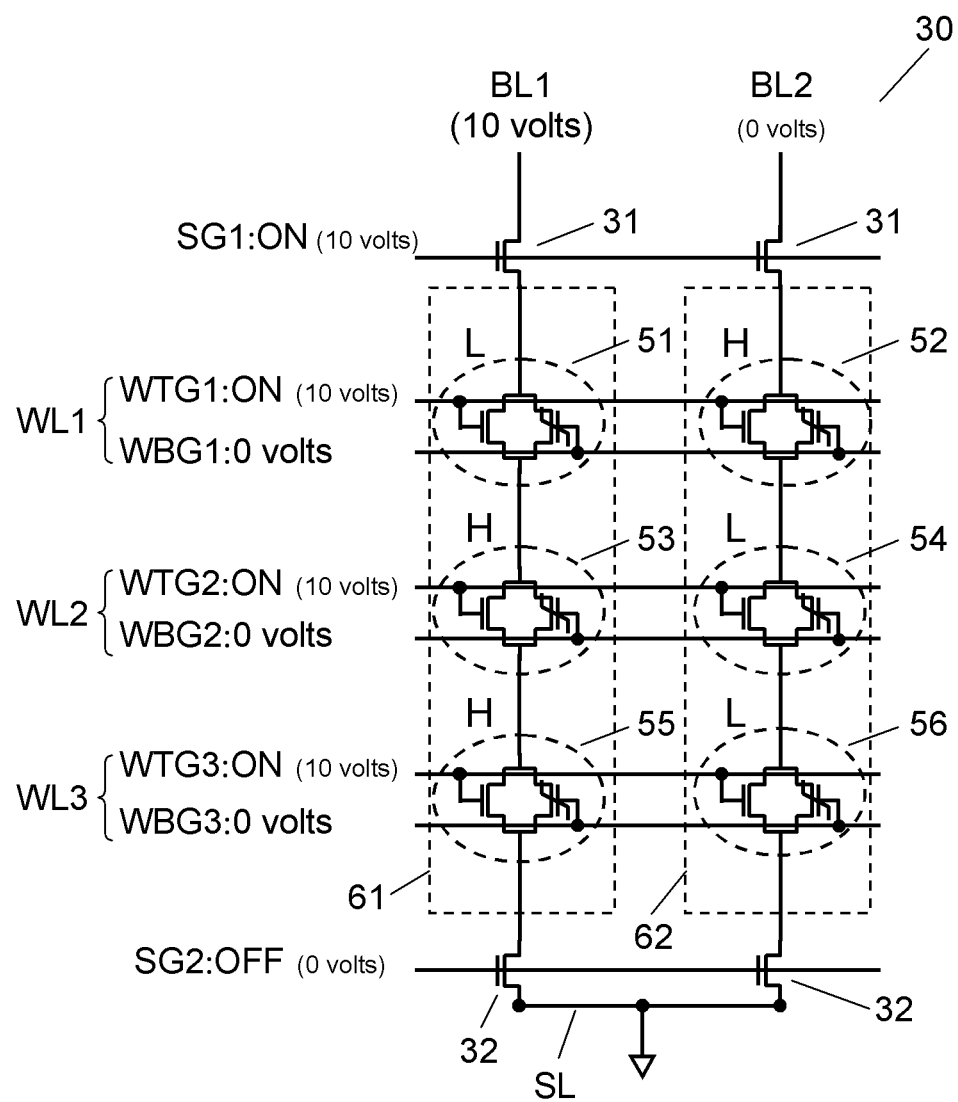
FIG. 8 shows the state in the step (d).

In the step (d), as shown in FIG. 8, the voltage applied to the second bottom gate word line WBG2 is decreased. In FIG. 8, the voltage decreases from 10 volts to 0 volts.

In the step (d), the following relationships are satisfied:

BL1V (e.g., 10 volts in FIG. 8)>BL2V (e.g., 0 volts in FIG. 8),

WBG1V (e.g., 0 volts in FIG. 8)<BL1V (e.g., 10 volts in FIG. 8),

WBG2V (e.g., 0 volts in FIG. 8)<BL1V (e.g., 10 volts in FIG. 8),

WBG1V (e.g., 0 volts in FIG. 8)=BL2V (e.g., 0 volts in FIG. 8), and

WBG2V (e.g., 0 volts in FIG. 8)=BL2V (e.g., 0 volts in FIG. 8).

It is remained that the ON voltage (e.g., 10 volts) is applied to each top gate word line WTG.

Similarly to the cases of the steps (b) and (c), since the relationship: WBG1V (e.g., 0 volts in FIG. 8)<BL1V (e.g., 10 volts in FIG. 8) is satisfied, the state of the first memory cell 51 is going to vary moderately from the low resistance state to the high resistance state as shown in FIG. 3B. However, as shown in FIG. 3B, the period: (tE−tB) of the steps (b) to (d) is shorter than the time t2. Accordingly, the state of the first memory cell 51 is remained in the low resistance state.

Since the relationship: WBG2V (e.g., 0 volts in FIG. 8)<BL1V (e.g., 10 volts in FIG. 8) is satisfied, the state of the third memory cell 53 is remained in the high resistance state. With regard to the fifth memory cell 55, since the state of the step (d) is the same as the states of the steps (b) and (c), the state of the fifth memory cell 55 is remained in the high resistance state.

Since the relationship: WBG1V (e.g., 0 volts in FIG. 8)=BL2V (e.g., 0 volts in FIG. 8) is satisfied, the state of the second memory cell 52 is not varied (here, remained in the high resistance state). Similarly, the state of the sixth memory cell 56 is not varied.

Unlike the case of FIG. 7, the relationship: WBG2V (e.g., 0 volts in FIG. 8)=BL2V (e.g., 0 volts in FIG. 8) is satisfied, the state of the fourth memory cell 54 is not varied. In other words, the state of the fourth memory cell 54 which has been varied to the low resistance state in the step (c) is remained in the low resistance state in the step (d).

In this way, the state of the fourth memory cell 54 varies from the high resistance state to the low resistance state, whereas the states of the other memory cells are not varied.

(Step (e))

It is preferable that the step (e) be performed after the step (d).

Figure 9:
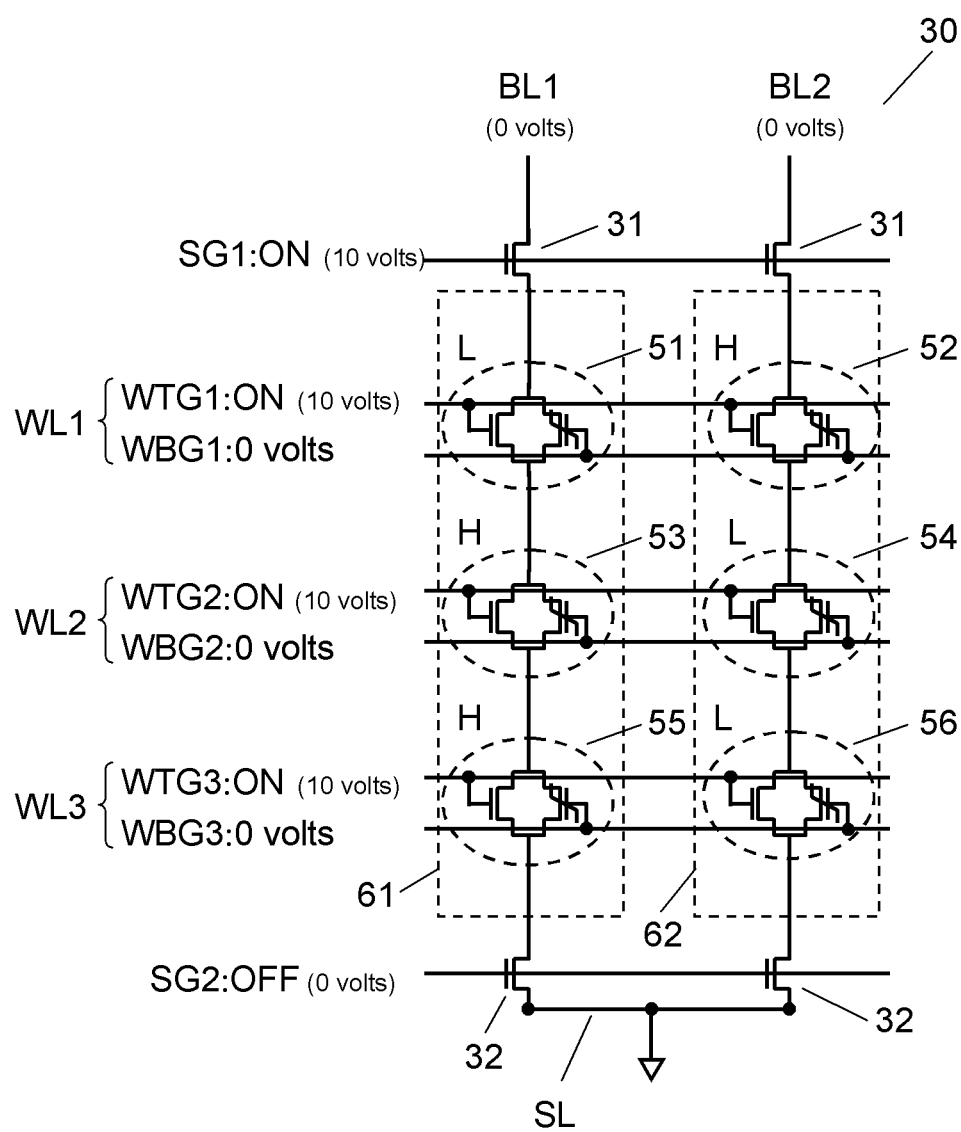
FIG. 9 shows the state in the step (e).

In the step (e), as shown in FIG. 9, the voltage applied to the first bit line BL1 is decreased. In FIG. 9, the voltage decreases from 10 volts to 0 volts.

In the step (e), the following relationships are satisfied:

BL1V (e.g., 0 volts in FIG. 9)=BL2V (e.g., 0 volts in FIG. 9),

WBG1V (e.g., 0 volts in FIG. 9)=BL1V (e.g., 0 volts in FIG. 9),

WBG2V (e.g., 0 volts in FIG. 9)=BL1V (e.g., 0 volts in FIG. 9),

WBG1V (e.g., 0 volts in FIG. 9)=BL2V (e.g., 0 volts in FIG. 9), and

WBG2V (e.g., 0 volts in FIG. 9)=BL2V (e.g., 0 volts in FIG. 9).

It is remained that the ON voltage (e.g., 10 volts) is applied to each top gate word line WTG.

Unlike the cases of the steps (b) to (d), since the relationship WBG1V (e.g., 0 volts in FIG. 9)=BL1V (e.g., 0 volts in FIG. 9) is satisfied, the state of the first memory cell 51 is not varied (here, remained in the low resistance state).

Since the relationship: WBG2V (e.g., 0 volts in FIG. 9)=BL1V (e.g., 0 volts in FIG. 9) is satisfied, the state of the third memory cell 53 is not varied (here, remained in the high resistance state). Similarly, the state of the fifth memory cell 55 is not varied (here, remained in the high resistance state).

Since the relationship: WBG1V (e.g., 0 volts in FIG. 9)=BL2V (e.g., 0 volts in FIG. 9) is satisfied, the state of the second memory cell 52 is not varied (here, remained in the high resistance state). Similarly, the state of the sixth memory cell 56 is not varied (here, remained in the low resistance state).

The relationship: WBG2V (e.g., 0 volts in FIG. 9)=BL2V (e.g., 0 volts in FIG. 9) is satisfied, the state of the fourth memory cell 54 is not varied.

Similarly in the step (d), the state of the fourth memory cell 54 which has been varied to the low resistance state in the step (c) is remained in the low resistance state in the step (e).

Figure 4:
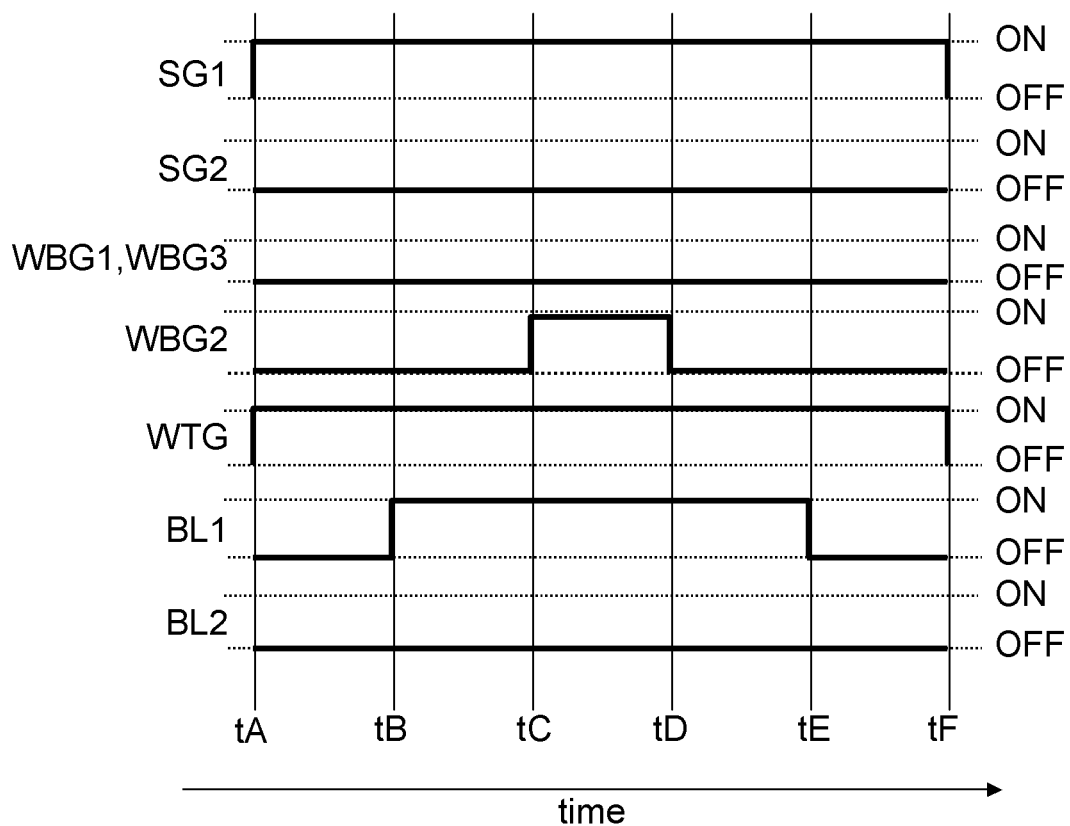
FIG. 4 shows relationships between the time and the voltages applied to the first select gate line SG1, the second select gate line SG2, the first bottom gate word line WBG1, the second bottom gate word line WBG2, the top gate word line WTG, the first bit line BL1, and the second bit line BL2 in steps (b) to (f).

FIG. 4 shows relationships between the time and the voltages applied to the first select gate line 31, the second select gate line 32, the first bottom gate word line WBG1, the second bottom gate word line WBG2, the top gate word line WTG, the first bit line BL1, and second bit line BL2 in the steps (b) to (f).

(Step (f))

It is preferable that the step (f) be performed after the step (e).

Figure 10:
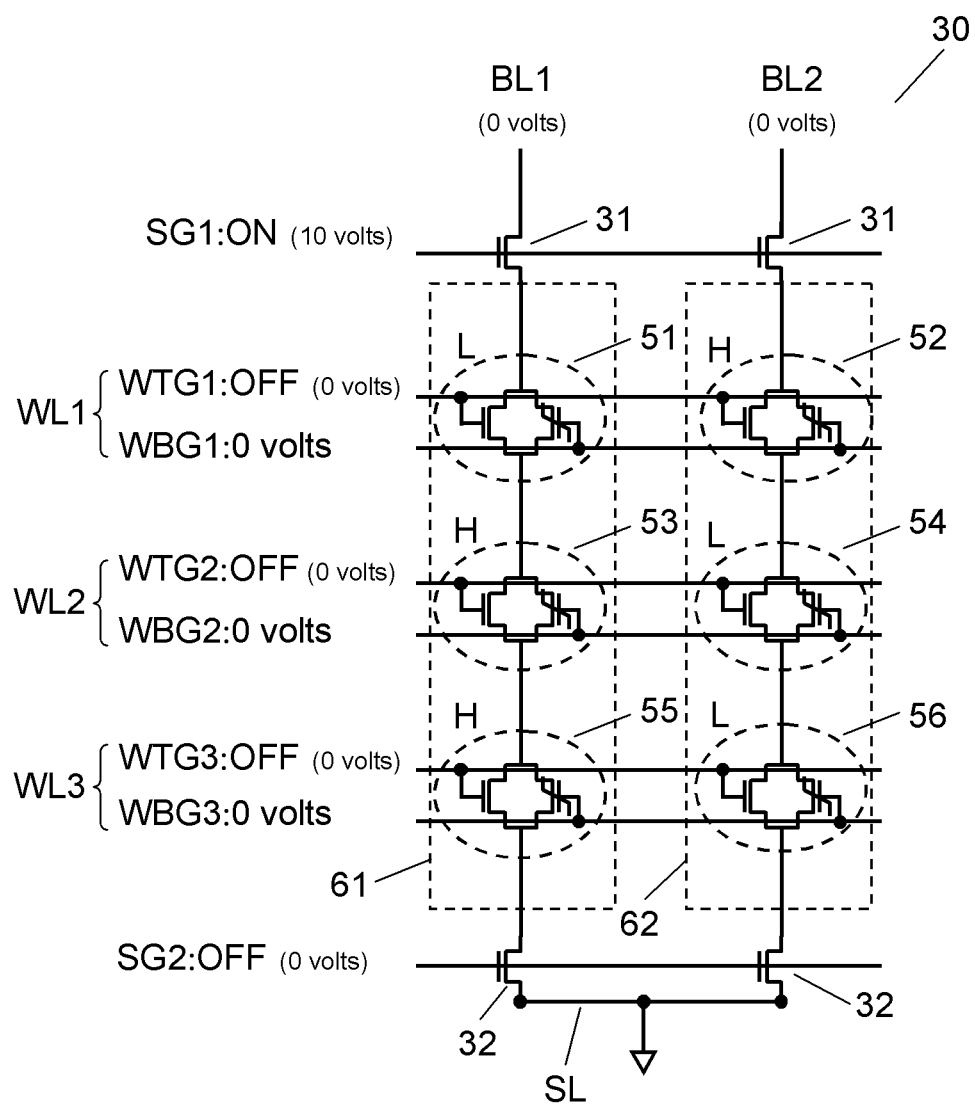
FIG. 10 shows the state in the step (f).

In the step (f), as shown in FIG. 10, all the voltages are turned into zero volts. In other words, in the step (f), the semiconductor memory device 30 is turned off. Since the first semiconductor transistor 18 of each memory cell 5 is non-volatile, the state of each memory cell 5, namely, either one of the high resistance state or the low resistance state, is maintained.

(Reset Step)

Figure 11:
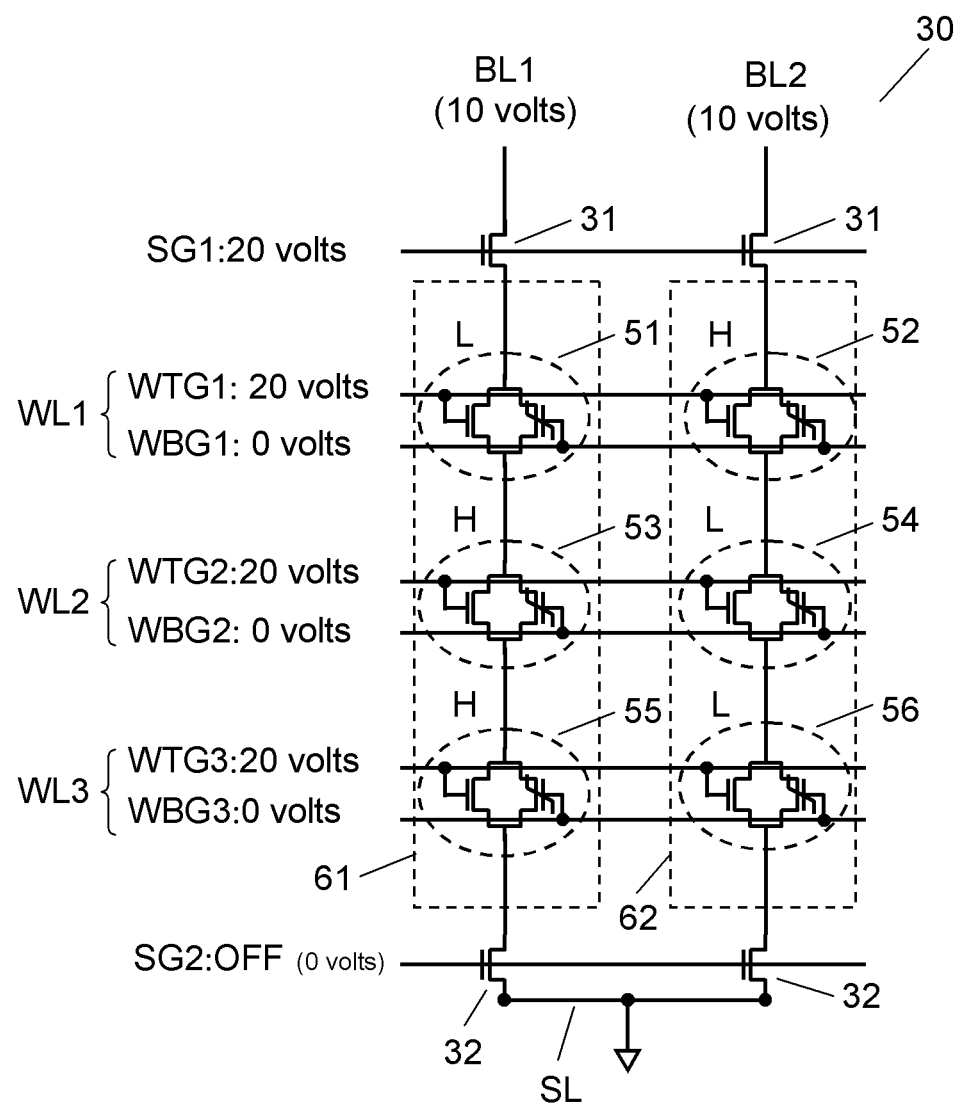
FIG. 11 shows the state in the reset step.

In the semiconductor memory device 30 of the present invention, the state of each memory cells 5 is not varied individually from the low resistance state to the high resistance state. As shown in FIG. 11, all the states of the memory cells 5 are integrally varied from the low resistance state to the high resistance state.

More particularly, the voltage applied to each of the bits lines BLs is increased. In FIG. 11, the voltage of more than 0 volts (e.g., 10 volts) is applied to each of the bits lines BLs. Furthermore, the voltages applied to all the top gate word lines WTGs are increased. Here, the voltages applied to all the top gate word lines WTGs are higher than the voltages applied to all the bits lines BLs. In FIG. 11, a voltage of 20 volts is applied to each of the top gate word lines WTGs. The voltages applied to all the bottom gate word lines WBGs remain in the OFF voltages (e.g., 0 volts). The ON voltage (e.g., 20 volts) is applied to first select gate line SG1 to turn the states of all the first select transistors 31 into the ON states. The OFF voltage (e.g., 0 volts) is applied to the second select gate line SG2 to turn the states of all the second select transistors 32 into the OFF states.

In the memory cell 5, the current flowing through the channel formed in the semiconductor film 14 is controlled in accordance with the direction of the polarization of the ferroelectric film 13. When the second gate electrode 17 has a higher voltage than the first gate electrode 12, and when the second gate electrode 17 has a higher voltage than the source electrode 15s and the drain electrode 15d, the direction of the polarization of the ferroelectric film 13 is caused to be downward.

When the polarization of the ferroelectric film 13 is downward, to be more exact, when the polarization of ferroelectric film 13 substantially faces the first gate electrode 12, electrons are drained from the semiconductor film 14. This stops the current flowing through the semiconductor film 14, and increases the resistance value of the memory cell 5. For more details, reference should be made to FIG. 3 and its description disclosed in Patent Literature 2.

In this way, the states of all the memory cells 5 are turned into the high resistance state.

(Reading Step)

Now, a procedure for reading the states of the memory cell 5 is described.

Figure 12:
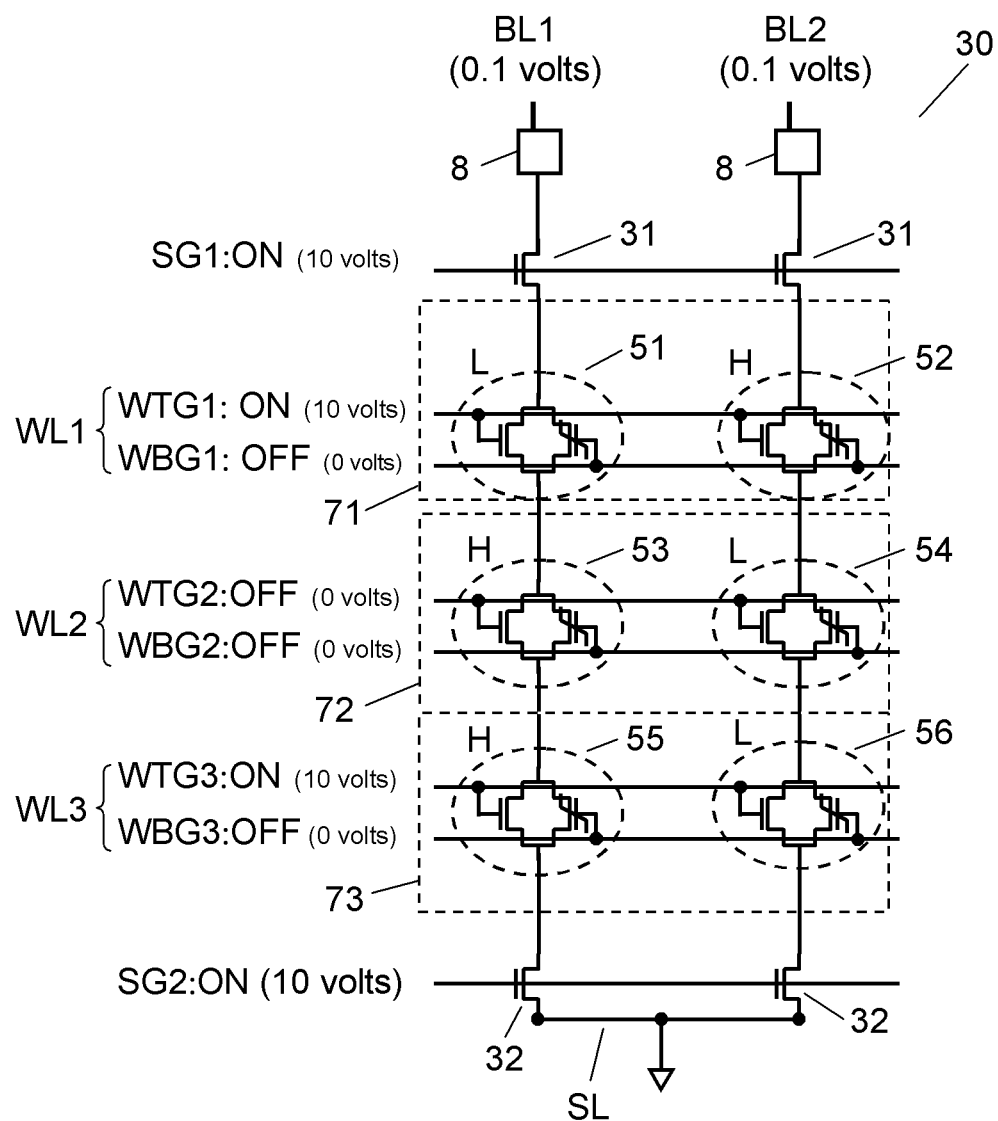
FIG. 12 shows the state in the reading step.

As shown in FIG. 12, the semiconductor memory device 30 has plural cell lines 7 formed parallel to the word line WL. One cell line 7 includes plural memory cells 5. In FIG. 12, a procedure for reading the states of the third memory cell 53 and the fourth memory cell 54 is described.

Each bit line BL includes a sense amplifier 8.

The OFF voltage (e.g., 0 volts) is applied to the top gate word line WTG included in the cell line 7 required to read its state. Here, the OFF voltage (e.g., 0 volts) is applied to the second top gate word line WTG2 included in the cell line 72.

The ON voltage (e.g., 10 volts) is applied to the other top gate word lines WTGs. A voltage of 0 volts is applied to all the bottom gate word lines WBGs. The ON voltage (e.g., 10 volts) is applied to the first select gate line SG1 to turn all the states of the first select transistors 31 into the ON state. Similarly, the ON voltage (e.g., 10 volts) is applied to the second select gate line SG2 to turn all the states of the second select transistors 32 into the ON state.

Furthermore, a reading voltage (e.g., 0.1 volt) is applied to each of the bit lines BLs. The reading voltage is much smaller than the voltage (except 0 volts) applied to the bit line BL in the steps (b) to (5). As one example, the reading voltage is one-fifth times lower than the voltage (10 volts, in FIG. 6-FIG. 8) applied to the bit line BL in the steps (b) to (f).

After applying the reading voltage at the reading step, the status of the memory cell 5 is judged at the judging step. When the reading voltage (e.g., 0.1 volt) is applied to each bit line BL, a current flows through each bit line BL. Since the ON voltage (e.g., 10 volts) is applied to each of the other top gate word lines WTGs, the current values are varied depending on the resistance values of the third memory cell 53 and the fourth memory cell 54 both of which are connected to the second top gate word line WTG2. The resistance values and the current values are measured by each sense amplifier 8. It is determined whether the high resistance state or the low resistance state each memory cell 5 has, based on the resistance values and the current values thus measured.

EXAMPLES

The following examples give detailed descriptions of the present invention.

Example 1

Prepared was a silicon substrate 1 having a surface covered with a silicon oxide film 2.

(1) A titanium film having a thickness of 5 nanometers and a platinum film having a thickness of 30 nanometers were formed on the silicon substrate 1 in this order by an electron gun vapor deposition technique. Furthermore, a $SrRuO_3$ (hereinafter, referred to as "SRO") film having a thickness of 10 nanometers was formed by a pulse laser deposition technique. Subsequently, a first gate electrode 12 was formed by a lift-off technique.

(2) Then, the silicon substrate 1 was heated to 700 degrees Celsius. A ferroelectric film 13 composed of $Pb(Zr,Ti)O_3$ having a thickness of 450 nanometers was formed by a pulse laser deposition technique.

(3) The temperature of the silicon substrate 1 was lowered to 400 degrees Celsius. Subsequently, a semiconductor film 14 composed of ZnO having a thickness of 30 nanometers was formed.

A resist pattern was formed on the semiconductor film 14 by a photolithography technique. Using nitric acid, an unnecessary part of the semiconductor film 14 was removed.

Then, a titanium film having a thickness of 5 nanometers and a platinum film having a thickness of 30 nanometers were formed on the semiconductor film 14 by an electron gun vapor deposition technique. Subsequently, a source electrode 15s and a drain electrode 15d each composed of the titanium film and the platinum film were formed by a lift-off technique.

A paraelectric film 16 composed of silicon nitride having a thickness of 100 nanometers was formed by a sputtering method in such a manner that the paraelectric film 16 covers the source electrode 15s, the drain electrode 15d, and the semiconductor film 14.

(7) A pattern was formed on the paraelectric film 16 by a photolithography technique. Furthermore, the paraelectric film 16 was provided with an opening by a reactive ion etching technique.

(8) A resist pattern was formed by a photolithography technique. Using a lift-off step, a titanium film having a thickness of 5 nanometers, a platinum film having a thickness of 30 nanometers, and a gold film having a thickness of 170 nanometers were formed. A second gate electrode 17 was formed of a laminate composed of these three films. Thus, a memory cell 5 was obtained. The channel width in memory cell 5 was 50 micrometers. The channel length was 20 micrometers.

As described in the reset step, the state of the memory cell 5 thus obtained was caused to be the high resistance state. More specifically, voltages of 20 volts, 10 volts, 10 volts, and 0 volts were applied to the second gate electrode 17, the source electrode 15s, the drain electrode 15d, the first gate electrode 12, respectively, for 1 second.

Then, the state of the memory cell 5 was varied from the high resistance state to the low resistance state.

More particularly, a voltage of 10 volts was applied to the first gate electrode 12. A voltage of 0 volts was applied to the drain electrode 15d. A voltage of 0 volts was applied to the source electrode 15s. Then, a voltage of 0 volts was applied to the first gate electrode 12. A voltage of 0.1 volt was applied to the drain electrode 15d. A voltage of 0 volts was applied to the source electrode 15s. The current value flowing through the semiconductor film 14 was measured with an ammeter connected to the source electrode 15s. Based on the measured current value, the resistance value of the memory cell 5 was calculated.

The left column of Table 1 shows an elapsed time during which the voltage was applied to the first gate electrode 12 (unit: second).

The right column of Table 1 shows the current value in each elapsed time (unit: ampere).

TABLE 1

Result of Example 1 From the high resistance state to the low resistance state.

| Time | Current |
|---|---|
| 1.00E−08 | 1.80E−12 |
| 1.26E−08 | 1.83E−12 |
| 1.58E−08 | 2.27E−12 |
| 2.00E−08 | 1.73E−12 |
| 2.51E−08 | 2.17E−12 |
| 3.16E−08 | 2.78E−12 |
| 3.98E−08 | 3.76E−12 |
| 5.01E−08 | 4.23E−12 |
| 6.31E−08 | 4.48E−12 |
| 7.94E−08 | 5.17E−12 |
| 1.00E−07 | 5.62E−12 |
| 1.26E−07 | 5.75E−12 |
| 1.58E−07 | 8.65E−12 |
| 2.00E−07 | 2.34E−11 |
| 2.51E−07 | 1.54E−10 |
| 3.16E−07 | 5.68E−10 |
| 3.98E−07 | 1.33E−09 |
| 5.01E−07 | 6.81E−09 |
| 6.31E−07 | 5.50E−08 |
| 7.94E−07 | 1.62E−07 |
| 1.00E−06 | 3.48E−07 |
| 1.26E−06 | 4.97E−07 |
| 1.58E−06 | 6.64E−07 |
| 2.00E−06 | 7.98E−07 |
| 2.51E−06 | 9.07E−07 |
| 3.16E−06 | 9.81E−07 |
| 3.98E−06 | 1.02E−06 |
| 5.01E−06 | 1.06E−06 |
| 6.31E−06 | 1.07E−06 |
| 7.94E−06 | 1.08E−06 |
| 1.00E−05 | 1.10E−06 |
| 1.26E−05 | 1.05E−06 |
| 1.58E−05 | 1.09E−06 |
| 2.00E−05 | 1.11E−06 |
| 2.51E−05 | 1.08E−06 |
| 3.16E−05 | 1.10E−06 |
| 3.98E−05 | 1.10E−06 |
| 5.01E−05 | 1.11E−06 |
| 6.31E−05 | 1.10E−06 |
| 7.94E−05 | 1.10E−06 |
| 1.00E−04 | 1.09E−06 |
| 1.00E−04 | 1.11E−06 |
| 1.47E−04 | 1.13E−06 |
| 2.15E−04 | 1.13E−06 |
| 3.16E−04 | 1.14E−06 |
| 4.64E−04 | 1.14E−06 |
| 6.81E−04 | 1.15E−06 |
| 1.00E−03 | 1.15E−06 |
| 0.00147 | 1.16E−06 |
| 0.00215 | 1.17E−06 |
| 0.00316 | 1.18E−06 |
| 0.00464 | 1.16E−06 |
| 0.00681 | 1.17E−06 |
| 0.01 | 1.17E−06 |
| 0.01468 | 1.16E−06 |
| 0.02154 | 1.15E−06 |
| 0.03162 | 1.14E−06 |
| 0.04642 | 1.12E−06 |
| 0.06813 | 1.10E−06 |
| 0.1 | 1.07E−06 |
| 0.14678 | 1.05E−06 |
| 0.21544 | 1.02E−06 |

TABLE 1-continued

Result of Example 1 From the high resistance state to the low resistance state.

| Time | Current |
|---|---|
| 0.31623 | 1.00E−06 |
| 0.46416 | 9.69E−07 |
| 0.68129 | 9.41E−07 |
| 1 | 9.08E−07 |

The state of the memory cell 5 was returned from the low resistance state to the high resistance state.

More specifically, a voltage of −10 volts was applied to the first gate electrode 12. A voltage of 0 volts was applied to the drain electrode 15d. A voltage of 0 volts was applied to the source electrode 15s. Then, a voltage of 0 volts was applied to the first gate electrode 12. A voltage of 0.1 volt was applied to the drain electrode 15d. A voltage of 0 volts was applied to the source electrode 15s. Similarly to Table 1, Table 2 shows the result.

TABLE 2

Result of Example 1 From the low resistance state to the high resistance state.

| Time | Current |
|---|---|
| 1.00E−08 | 6.22E−07 |
| 1.26E−08 | 6.78E−07 |
| 1.58E−08 | 6.87E−07 |
| 2.00E−08 | 7.13E−07 |
| 2.51E−08 | 6.86E−07 |
| 3.16E−08 | 7.19E−07 |
| 3.98E−08 | 7.28E−07 |
| 5.01E−08 | 7.27E−07 |
| 6.31E−08 | 7.45E−07 |
| 7.94E−08 | 7.39E−07 |
| 1.00E−07 | 7.40E−07 |
| 1.26E−07 | 7.31E−07 |
| 1.58E−07 | 7.41E−07 |
| 2.00E−07 | 7.34E−07 |
| 2.51E−07 | 7.49E−07 |
| 3.16E−07 | 7.36E−07 |
| 3.98E−07 | 7.47E−07 |
| 5.01E−07 | 7.43E−07 |
| 6.31E−07 | 7.37E−07 |
| 7.94E−07 | 6.84E−07 |
| 1.00E−06 | 7.14E−07 |
| 1.26E−06 | 7.11E−07 |
| 1.58E−06 | 7.06E−07 |
| 2.00E−06 | 7.16E−07 |
| 2.51E−06 | 7.21E−07 |
| 3.16E−06 | 7.04E−07 |
| 3.98E−06 | 7.07E−07 |
| 5.01E−06 | 6.88E−07 |
| 6.31E−06 | 6.66E−07 |
| 7.94E−06 | 6.43E−07 |
| 1.00E−05 | 6.20E−07 |
| 1.26E−05 | 5.77E−07 |
| 1.58E−05 | 5.36E−07 |
| 2.00E−05 | 4.81E−07 |
| 2.51E−05 | 4.20E−07 |
| 3.16E−05 | 3.45E−07 |
| 3.98E−05 | 2.88E−07 |
| 5.01E−05 | 2.19E−07 |
| 6.31E−05 | 1.56E−07 |
| 7.94E−05 | 9.47E−08 |
| 1.00E−04 | 4.99E−08 |
| 1.26E−04 | 2.51E−08 |
| 1.58E−04 | 1.42E−08 |
| 2.00E−04 | 8.73E−09 |
| 2.51E−04 | 5.66E−09 |
| 3.16E−04 | 3.49E−09 |
| 3.98E−04 | 2.23E−09 |
| 5.01E−04 | 1.55E−09 |

TABLE 2-continued

Result of Example 1 From the low resistance state to the high resistance state.

| Time | Current |
|---|---|
| 6.31E−04 | 9.70E−10 |
| 7.94E−04 | 6.49E−10 |
| 1.00E−03 | 3.78E−10 |
| 0.00126 | 2.32E−10 |
| 0.00158 | 1.38E−10 |
| 0.002 | 7.95E−11 |
| 0.00251 | 5.54E−11 |
| 0.00316 | 3.11E−11 |
| 0.00398 | 1.98E−11 |
| 0.00501 | 1.25E−11 |
| 0.00631 | 1.01E−11 |
| 0.00794 | 7.84E−12 |
| 0.01 | 6.29E−12 |
| 0.01259 | 5.41E−12 |
| 0.01585 | 4.75E−12 |
| 0.01995 | 4.04E−12 |
| 0.02512 | 4.08E−12 |
| 0.03162 | 3.37E−12 |
| 0.03981 | 3.29E−12 |
| 0.05012 | 3.19E−12 |
| 0.0631 | 2.95E−12 |
| 0.07943 | 2.96E−12 |
| 0.1 | 2.39E−12 |
| 0.12589 | 2.53E−12 |
| 0.15849 | 2.24E−12 |
| 0.19953 | 1.99E−12 |
| 0.25119 | 1.89E−12 |
| 0.31623 | 1.95E−12 |
| 0.39811 | 1.50E−12 |
| 0.50119 | 1.36E−12 |
| 0.63096 | 1.09E−12 |
| 0.79433 | 6.40E−13 |
| 1 | 7.10E−13 |

Figure 13:
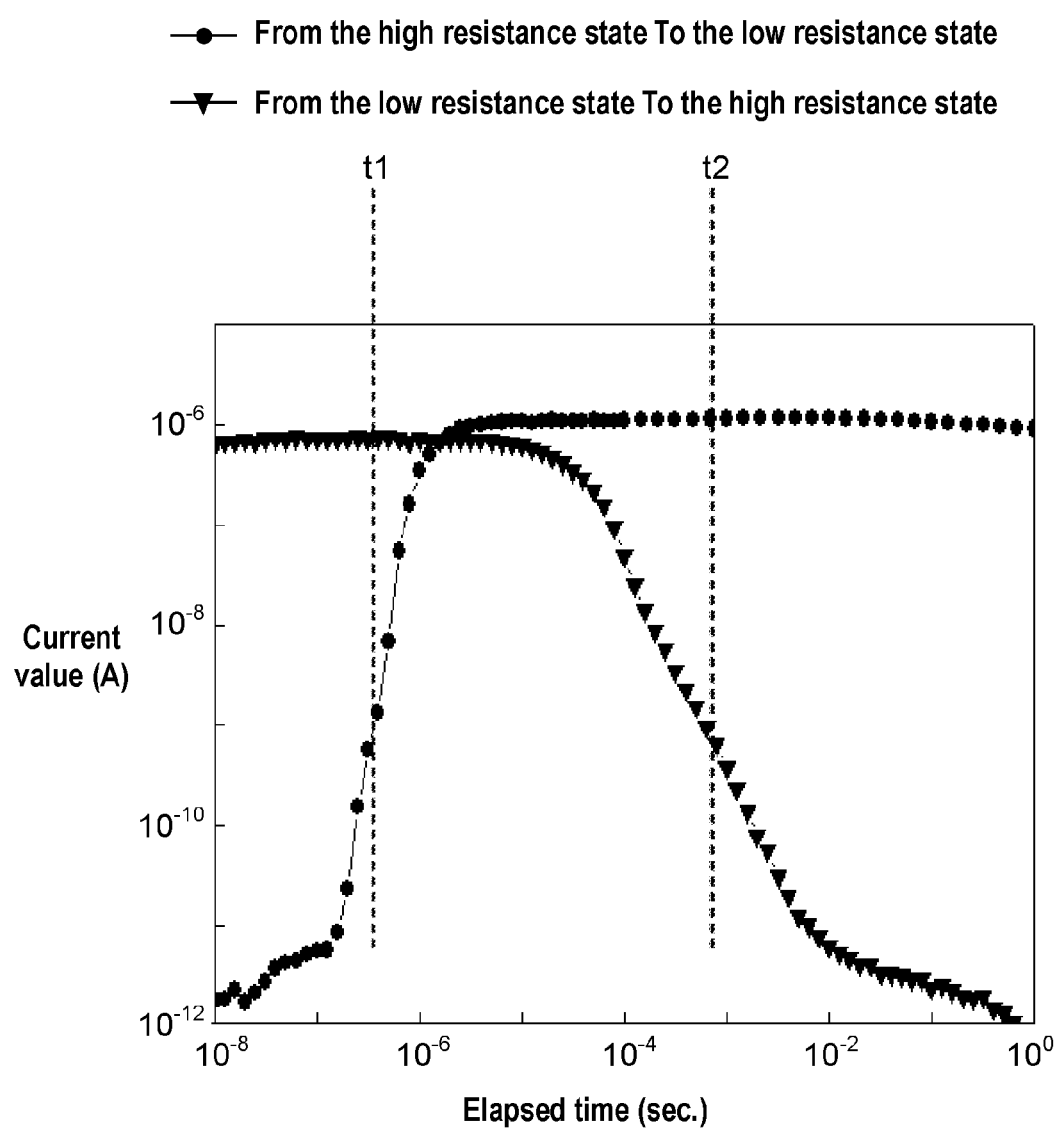
FIG. 13 shows the result in the example 1.

FIG. 13 is a graph plotted from the results shown in Table 1 and Table 2. The black circle indicates the change from the high resistance state to the low resistance state. The black triangle indicates the change from the low resistance state to the high resistance state.

As is clear from FIG. 13, the following relationship is satisfied:

t1<t2 where t1 represents the period necessary for varying the state of the memory cell 5 from the high resistance state to the low resistance state, after the voltage of 10 volts was applied to the first gate electrode 12, and t2 represents the period necessary for varying the state of the memory cell 5 from the low resistance state to the high resistance state, after the voltage of −10 volts was applied to the first gate electrode 12.

The values of t1 and t2 estimated from Table 1 and Table 2 were approximately $3 \times 10^{-7}$ second and $5 \times 10^{-4}$ second, respectively.

Example 2

An experiment similar to that of the example 1 was performed, except that the ferroelectric film 13 had the thickness of 675 nanometers, the channel width was 100 micrometers, the channel length was 3 micrometers, and voltages of +15 volts and −15 volts were applied to the first gate electrode 12.

Figure 14:
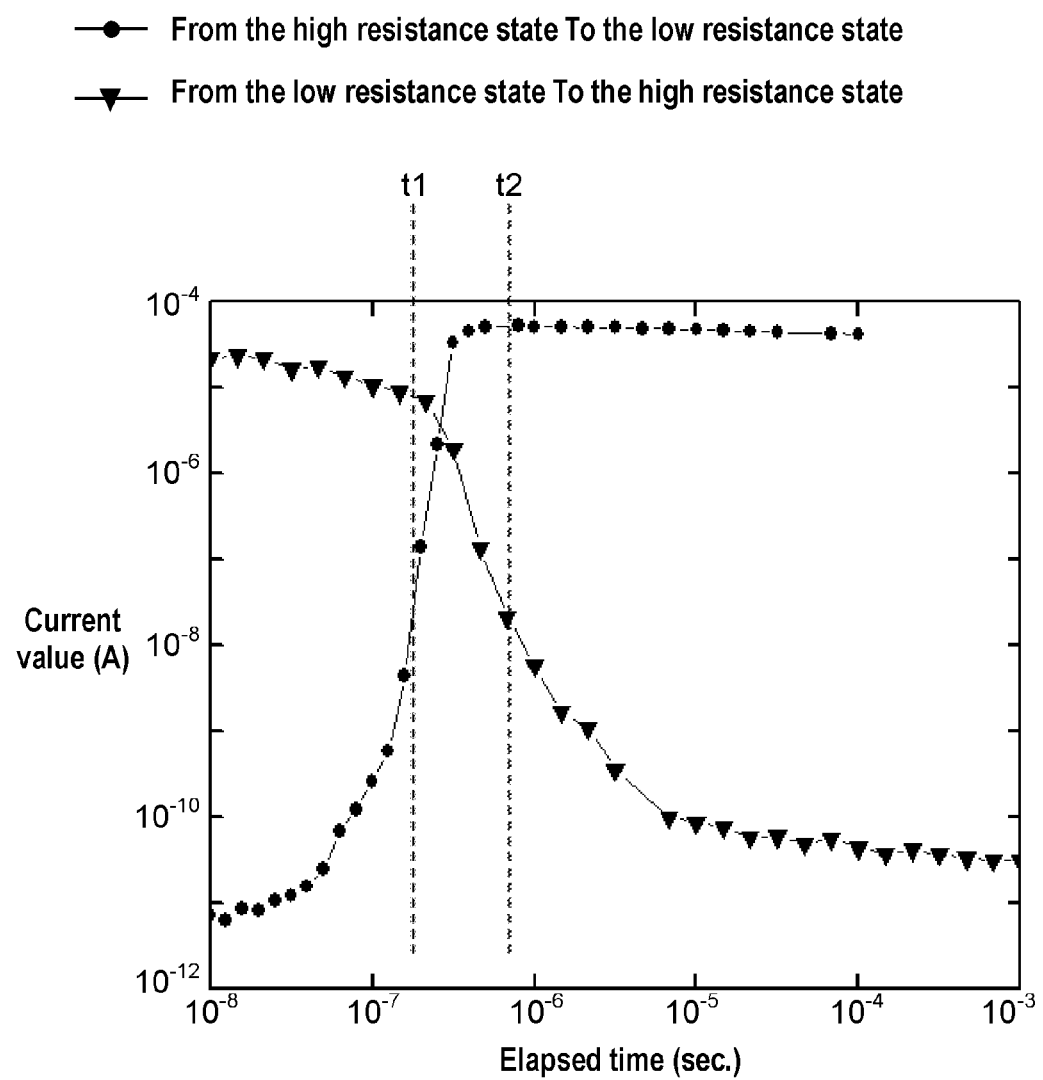
FIG. 14 shows the result in the example 2.

Table 3, Table 4, and FIG. 14 show the results of the example 2. The black circle indicates the change from the high resistance state to the low resistance state. The black triangle indicates the change from the low resistance state to the high resistance state.

The values of t1 and t2 estimated from Table 3 and Table 4 were approximately $1.5 \times 10^{-7}$ second and $9 \times 10^{-7}$ second, respectively.

TABLE 3

Result of Example 2 From the high resistance state to the low resistance state.

| Time | Current |
|---|---|
| 1.00E−08 | 6.91E−12 |
| 1.26E−08 | 6.29E−12 |
| 1.58E−08 | 8.56E−12 |
| 2.00E−08 | 8.15E−12 |
| 2.51E−08 | 1.04E−11 |
| 3.16E−08 | 1.19E−11 |
| 3.98E−08 | 1.54E−11 |
| 5.01E−08 | 2.44E−11 |
| 6.31E−08 | 6.64E−11 |
| 7.94E−08 | 1.21E−10 |
| 1.00E−07 | 2.56E−10 |
| 1.26E−07 | 5.77E−10 |
| 1.58E−07 | 4.37E−09 |
| 2.00E−07 | 1.39E−07 |
| 2.51E−07 | 2.14E−06 |
| 3.16E−07 | 3.29E−05 |
| 3.98E−07 | 4.47E−05 |
| 5.01E−07 | 5.06E−05 |
| 7.94E−07 | 5.15E−05 |
| 1.00E−06 | 5.09E−05 |
| 1.47E−06 | 5.05E−05 |
| 2.15E−06 | 4.99E−05 |
| 3.16E−06 | 4.94E−05 |
| 4.64E−06 | 4.84E−05 |
| 6.81E−06 | 4.85E−05 |
| 1.00E−05 | 4.66E−05 |
| 1.47E−05 | 4.59E−05 |
| 2.15E−05 | 4.47E−05 |
| 3.16E−05 | 4.39E−05 |
| 6.81E−05 | 4.22E−05 |
| 1.00E−04 | 4.10E−05 |

TABLE 4

Result of Example 2 From the low resistance state to the high resistance state.

| Time | Current |
|---|---|
| 1.00E−08 | 2.17E−05 |
| 1.47E−08 | 2.34E−05 |
| 2.15E−08 | 2.17E−05 |
| 3.16E−08 | 1.62E−05 |
| 4.64E−08 | 1.73E−05 |
| 6.81E−08 | 1.32E−05 |
| 1.00E−07 | 1.06E−05 |
| 1.47E−07 | 8.75E−06 |
| 2.15E−07 | 6.79E−06 |
| 3.16E−07 | 1.92E−06 |
| 4.64E−07 | 1.32E−07 |
| 6.81E−07 | 2.07E−08 |
| 1.00E−06 | 5.71E−09 |
| 1.47E−06 | 1.64E−09 |
| 2.15E−06 | 1.08E−09 |
| 3.16E−06 | 3.50E−10 |
| 6.81E−06 | 9.81E−11 |
| 1.00E−05 | 8.59E−11 |
| 1.47E−05 | 7.40E−11 |
| 2.15E−05 | 5.65E−11 |
| 3.16E−05 | 5.82E−11 |
| 4.64E−05 | 4.81E−11 |
| 6.81E−05 | 5.54E−11 |
| 1.00E−04 | 4.31E−11 |
| 1.47E−04 | 3.66E−11 |
| 2.15E−04 | 4.10E−11 |
| 3.16E−04 | 3.61E−11 |
| 4.64E−04 | 3.27E−11 |
| 6.81E−04 | 3.11E−11 |
| 1.00E−03 | 3.08E−11 |

Example 3

An experiment similar to that of the example 2 was performed, except that the channel length was 5 micrometers.

Figure 15:
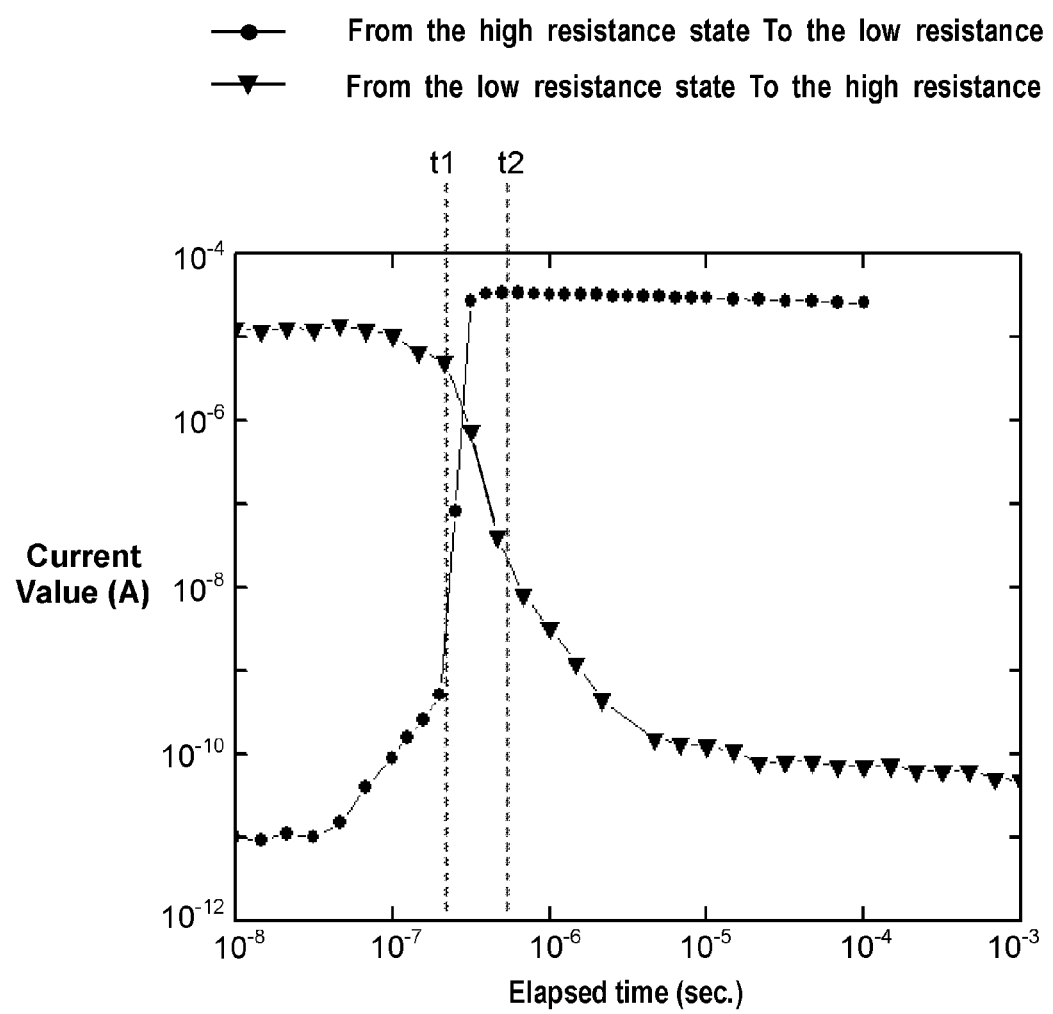
FIG. 15 shows the result in the example 3.

Table 5, Table 6, and FIG. 15 show the results of the example 3. The black circle indicates the change from the high resistance state to the low resistance state. The black triangle indicates the change from the low resistance state to the high resistance state.

The values of t1 and t2 estimated from Table 5 and Table 6 were approximately $2\times10^{-7}$ second and $7\times10^{-7}$ second, respectively.

TABLE 5

Result of Example 3 From the high resistance state to the low resistance state.

| Time | Current |
|---|---|
| 1.00E−08 | 1.01E−11 |
| 1.47E−08 | 9.18E−12 |
| 2.15E−08 | 1.08E−11 |
| 3.16E−08 | 9.91E−12 |
| 4.64E−08 | 1.49E−11 |
| 6.81E−08 | 3.93E−11 |
| 1.00E−07 | 8.97E−11 |
| 1.26E−07 | 1.59E−10 |
| 1.58E−07 | 2.54E−10 |
| 2.00E−07 | 5.08E−10 |
| 2.51E−07 | 8.01E−08 |
| 3.16E−07 | 2.65E−05 |
| 3.98E−07 | 3.28E−05 |
| 5.01E−07 | 3.36E−05 |
| 6.31E−07 | 3.32E−05 |
| 7.94E−07 | 3.29E−05 |
| 1.00E−06 | 3.26E−05 |
| 1.26E−06 | 3.24E−05 |
| 1.58E−06 | 3.21E−05 |
| 2.00E−06 | 3.17E−05 |
| 2.51E−06 | 3.13E−05 |
| 3.16E−06 | 3.08E−05 |
| 3.98E−06 | 3.04E−05 |
| 5.01E−06 | 3.01E−05 |
| 6.31E−06 | 2.97E−05 |
| 7.94E−06 | 2.93E−05 |
| 1.00E−05 | 2.90E−05 |
| 1.47E−05 | 2.85E−05 |
| 2.15E−05 | 2.79E−05 |
| 3.16E−05 | 2.74E−05 |
| 4.64E−05 | 2.67E−05 |
| 6.81E−05 | 2.60E−05 |
| 1.00E−04 | 2.53E−05 |

TABLE 6

Result of Example 3 From the low resistance state to the high resistance state.

| Time | Current |
|---|---|
| 1.00E−08 | 1.29E−05 |
| 1.47E−08 | 1.18E−05 |
| 2.15E−08 | 1.29E−05 |
| 3.16E−08 | 1.22E−05 |
| 4.64E−08 | 1.38E−05 |
| 6.81E−08 | 1.20E−05 |
| 1.00E−07 | 1.05E−05 |
| 1.47E−07 | 6.66E−06 |
| 2.15E−07 | 5.10E−06 |
| 3.16E−07 | 7.46E−07 |
| 4.64E−07 | 4.07E−08 |
| 6.81E−07 | 7.92E−09 |
| 1.00E−06 | 3.26E−09 |
| 1.47E−06 | 1.23E−09 |
| 2.15E−06 | 4.45E−10 |
| 4.64E−06 | 1.54E−10 |
| 6.81E−06 | 1.34E−10 |
| 1.00E−05 | 1.24E−10 |
| 1.47E−05 | 1.09E−10 |
| 2.15E−05 | 7.71E−11 |
| 3.16E−05 | 8.20E−11 |
| 4.64E−05 | 7.96E−11 |
| 6.81E−05 | 7.11E−11 |
| 1.00E−04 | 7.06E−11 |
| 1.47E−04 | 7.25E−11 |
| 2.15E−04 | 6.27E−11 |
| 3.16E−04 | 6.23E−11 |
| 4.64E−04 | 6.30E−11 |
| 6.81E−04 | 5.09E−11 |
| 1.00E−03 | 4.82E−11 |

Example 4

An experiment similar to that of the example 2 was performed, except that the channel length was 10 micrometers.

Figure 16:
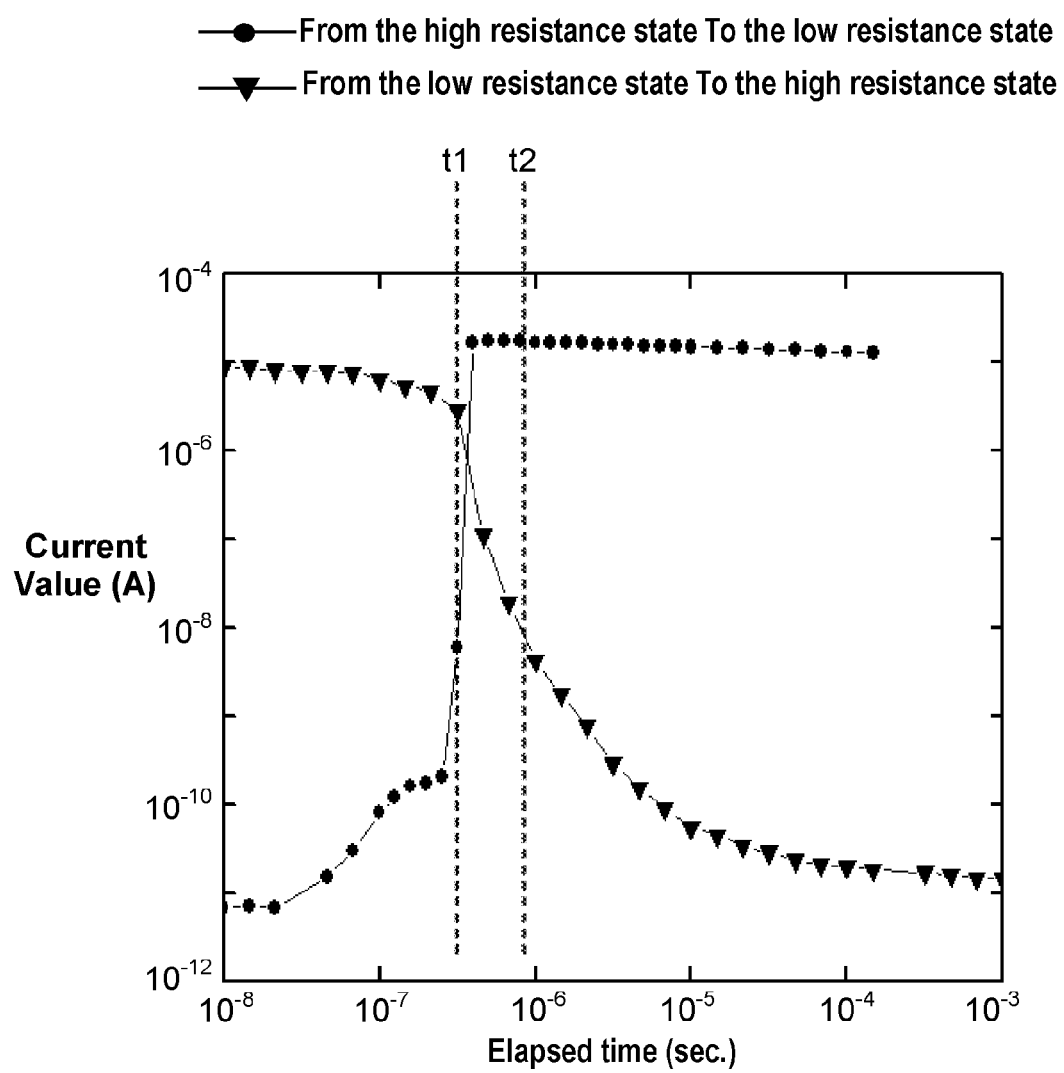
FIG. 16 shows the result in the example 4.
Figure 17:
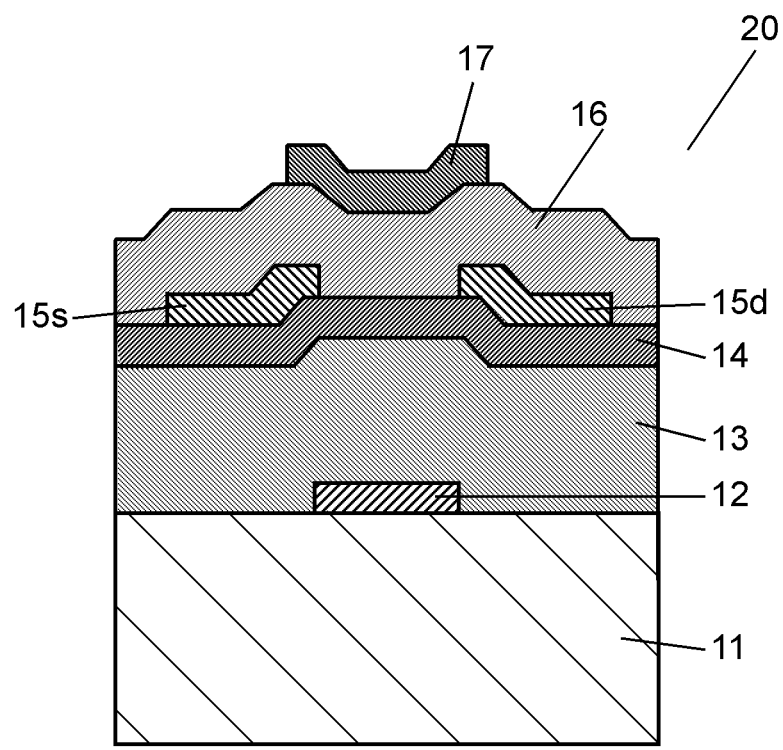
FIG. 17 shows a reproduction of FIG. 1(a) of Patent Literature 1.
Figure 18:
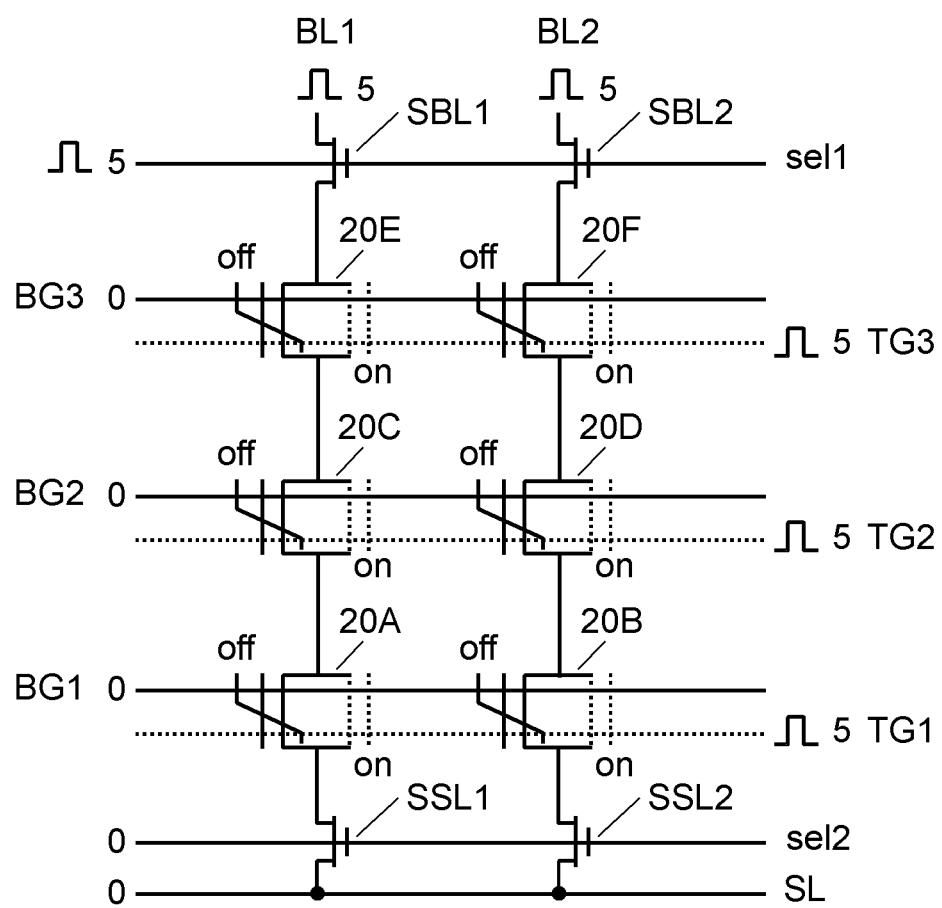
FIG. 18 shows a reproduction of FIG. 19(a) of Patent Literature 1.

Table 7, Table 8, and FIG. 16 show the results of the example 3. The black circle indicates the change from the high resistance state to the low resistance state. The black triangle indicates the change from the low resistance state to the high resistance state.

The values of t1 and t2 estimated from Table 7 and Table 8 were approximately $3\times10^{-7}$ second and $9\times10^{-7}$ second, respectively.

TABLE 7

Result of Example 4 From the high resistance state to the low resistance state.

| Time | Current |
|---|---|
| 1.00E−08 | 6.69E−12 |
| 1.47E−08 | 7.15E−12 |
| 2.15E−08 | 6.68E−12 |
| 4.64E−08 | 1.51E−11 |
| 6.81E−08 | 2.96E−11 |
| 1.00E−07 | 8.00E−11 |
| 1.26E−07 | 1.21E−10 |
| 1.58E−07 | 1.60E−10 |
| 2.00E−07 | 1.73E−10 |
| 2.51E−07 | 2.06E−10 |
| 3.16E−07 | 5.95E−09 |
| 3.98E−07 | 1.65E−05 |
| 5.01E−07 | 1.71E−05 |
| 6.31E−07 | 1.70E−05 |
| 7.94E−07 | 1.70E−05 |
| 1.00E−06 | 1.68E−05 |
| 1.26E−06 | 1.67E−05 |
| 1.58E−06 | 1.65E−05 |
| 2.00E−06 | 1.63E−05 |
| 2.51E−06 | 1.61E−05 |
| 3.16E−06 | 1.59E−05 |
| 3.98E−06 | 1.58E−05 |
| 5.01E−06 | 1.55E−05 |
| 6.31E−06 | 1.53E−05 |
| 7.94E−06 | 1.51E−05 |
| 1.00E−05 | 1.49E−05 |
| 1.00E−05 | 1.48E−05 |
| 1.47E−05 | 1.45E−05 |
| 2.15E−05 | 1.43E−05 |
| 3.16E−05 | 1.40E−05 |
| 4.64E−05 | 1.36E−05 |
| 6.81E−05 | 1.33E−05 |
| 1.00E−04 | 1.30E−05 |
| 1.47E−04 | 1.26E−05 |

TABLE 8

Result of Example 4 From the low resistance state to the high resistance state.

| Time | Current |
|---|---|
| 1.00E−08 | 8.65E−06 |
| 1.47E−08 | 8.79E−06 |
| 2.15E−08 | 7.99E−06 |
| 3.16E−08 | 7.88E−06 |
| 4.64E−08 | 7.85E−06 |
| 6.81E−08 | 7.57E−06 |
| 1.00E−07 | 6.41E−06 |
| 1.47E−07 | 5.29E−06 |
| 2.15E−07 | 4.54E−06 |
| 3.16E−07 | 2.79E−06 |
| 4.64E−07 | 1.10E−07 |
| 6.81E−07 | 1.91E−08 |
| 1.00E−06 | 4.13E−09 |
| 1.47E−06 | 1.73E−09 |
| 2.15E−06 | 7.59E−10 |
| 3.16E−06 | 2.88E−10 |
| 4.64E−06 | 1.51E−10 |
| 6.81E−06 | 8.98E−11 |
| 1.00E−05 | 5.41E−11 |
| 1.47E−05 | 4.47E−11 |
| 2.15E−05 | 3.35E−11 |
| 3.16E−05 | 2.88E−11 |
| 4.64E−05 | 2.33E−11 |
| 6.81E−05 | 2.05E−11 |
| 1.00E−04 | 2.00E−11 |
| 1.47E−04 | 1.83E−11 |
| 3.16E−04 | 1.69E−11 |
| 4.64E−04 | 1.58E−11 |
| 6.81E−04 | 1.46E−11 |
| 1.00E−03 | 1.46E−11 |

INDUSTRIAL APPLICABILITY

The present invention provides a novel method for driving a semiconductor memory device.

REFERENTIAL SIGNS LIST

1: silicon substrate
2: silicon oxide film
11: substrate
12: first gate electrode
13: ferroelectric film
14: semiconductor film
15s: source electrode
15d: drain electrode
16: paraelectric film
17: second gate electrode
18: first semiconductor transistor
19: second semiconductor transistor
30: semiconductor memory device
31: first select gate transistor
32: second select gate transistor
5: memory cell
  51: first memory cell
  52: second memory cell
  53: third memory cell
  54: fourth memory cell
  55: fifth memory cell
  56: sixth memory cell
6: cell column
  61: first cell column
  62: second cell column
7: cell line
  71: first cell line
  72: second cell line
  73: third cell line
SG1: first select gate line
SG2: second select gate line
WL: word line
WL1: first word line
WL2: second word line
WL3: third word line
WTG: top gate word line
WTG1: first top gate word line
WTG2: second top gate word line
WTG3: third top gate word line
WBG: bottom gate word line
WBG1 first bottom gate word line
WBG2: second bottom gate word line
WGB3: third bottom gate word line
BL: bit line
BL1: first bit line
BL2: second bit line
SL: source line

The invention claimed is:

1. A method for driving a semiconductor memory device, the method comprising steps of:
a step (a) of preparing the semiconductor memory device; wherein
the semiconductor memory device comprises:
  at least two bit lines (BL);
  at least two word lines (WL); and
  at least four memory cells (5) disposed at intersections of each bit line (BL) and each word line (WL); wherein
  the at least two bit lines (BL) include a first bit line (BL1) and a second bit line (BL2);
  the at least two word lines (WL) include a first word line (WL1) and a second word line (WL2);
  the at least four memory cells (5) include first to fourth memory cells (51, 52, 53, 54);
each memory cell (51, 52, 53, 54) comprises:
  a first gate electrode (12);
  a ferroelectric film (13);
  a semiconductor film (14);
  a source electrode (15s);
  a drain electrode (15d);
  a paraelectric film (16); and
  a second gate electrode (17);
the ferroelectric film (13) is interposed between the first gate electrode (12) and the semiconductor film (14);
the source electrode (15s) and the drain electrode (15d) are interposed between the semiconductor film (14) and the paraelectric film (16),
the first gate electrode (12), the ferroelectric film (13), the source electrode (15s), and the drain electrode (15d) constitute a first semiconductor transistor (18);
the second gate electrode (17), the paraelectric film (16), the source electrode (15s), and the drain electrode (15d) constitute a second semiconductor transistor (19);
the first word line (WL1) comprises a first top gate word line (WTG1) and a first bottom gate word line (WGB1);
the second word line (WL2) comprises a second top gate word line (WTG2) and a second bottom gate word line (WGB2);
the first top gate word line (WTG1) is electrically connected to the second gate electrodes (17) of the first and second memory cells (51, 52);

the first bottom gate word line (WBG1) is electrically connected to the first gate electrodes (12) of the first and second memory cells (51, 52);

the second top gate word line (WTG2) is electrically connected to the second gate electrodes (17) of the third and fourth memory cells (53, 54);

the second bottom gate word line (WBG2) is electrically connected to the first gate electrodes (12) of the third and fourth memory cells (53, 54);

the first bit line (BL1) is electrically connected to the drain electrode (15d) of the first memory cell (51);

the source electrode (15s) of the first memory cell (51) is electrically connected to the drain electrode (15d) of the third memory cell (53);

the second bit line (BL2) is electrically connected to the drain electrode (15d) of the second memory cell (52);

the source electrode (15s) of the second memory cell (52) is electrically connected to the drain electrode (15d) of the fourth memory cell (54);

each of the first to third memory cells (51 to 53) has either a low resistance state or a high resistance state; and the fourth memory cell (54) has the high resistance state;

a step (b) of applying voltages BL1V, BL2V, WBG1V, and WBG2V which satisfy the following relationship from time tB to time tC, while an ON voltage is applied to the first top gate word line (WTG1) and to the second top gate word line (WTG2), after the step (a), so as to maintain the states of the first to fourth memory cells (51 to 54);

BL1V>BL2V

WBG1V<BL1V

WBG2V<BL1V

WBG1V=BL2V, and

WBG2V=BL2V where

BL1V represents a voltage applied to the first bit line (BL1);

BL2V represents a voltage applied to the second bit line (BL2);

WTG1V represents a voltage applied to the first top gate word line (WTG1);

WBG1V represents a voltage applied to the first bottom gate word line (WBG1); and WTG2V represents a voltage applied to the second top gate word line (WTG1); and WBG2V represents a voltage applied to the second bottom gate word line (WBG2);

a step (c) of applying voltages BL1V, BL2V, WBG1V, and WBG2V which satisfy the following relationship from the time tC to time tD, while an ON voltage is applied to the first top gate word line (WTG1) and to the second top gate word line (WTG2), after the step (b), so as to maintain the states of the first to third memory cells (51 to 53), however, so as to vary the state of the fourth memory cell (54) from the high resistance state to the low resistance state; and

BL1V>BL2V

WBG1V<BL1V

WBG2V=BL1V

WBG1V=BL2V, and

WBG2V>BL2V a step (d) of applying voltages BL1V, BL2V, WBG1V, and WBG2V which satisfy the following relationship from the time tD to time tE, while an ON voltage is applied to the first top gate word line (WTG1) and to the second top gate word line (WTG2), after the step (c), so as to maintain the states of the first to fourth memory cells (51 to 54);

BL1V>BL2V

WBG1V<BL1V

WBG2V<BL1V

WBG1V=BL2V, and

WBG2V=BL2V wherein an inequality set: t1<tD−tC<tE−tB<t2 is satisfied;

where t1 represents time necessary for the memory cell to vary from the high resistance state to the low resistance state; and t2 represents time necessary for the memory cell to vary from the low resistance state to the high resistance state.

2. The method according to claim 1, wherein
the ferroelectric film (13) is in contact with the semiconductor film (14).

3. The method according to claim 1, further comprising:
a step (e) of applying voltages BL1V, BL2V, WBG1V, and WBG2V which satisfy the following relationship from the time tE to time tF, while an ON voltage is applied to the first top gate word line (WTG1) and to the second top gate word line (WTG2), after the step (d), so as to maintain the states of the first to fourth memory cells (51 to 54);

BL1V=BL2V

WBG1V=BL1V

WBG2V=BL1V

WBG1V=BL2V, and

WBG2V=BL2V.

4. The method according to claim 3, further comprising:
a step (f) of applying voltages BL1V, BL2V, WBG1V, WBG2V, WTG1V, and WTG2V which satisfy the following relationship after the step (d), so as to turn off the semiconductor memory device;

BL1V=BL2V=WBG1V=WGB2V=WTG1V=WTG2V=0 volts where

WTG1V represents a voltage applied to the first top gate word line (WTG1); and

WTG2V represents a voltage applied to the second top gate word line (WTG2).

5. The method according to claim 3, further comprising:
a reset step of applying voltages BL1V, BL2V, WBG1V, WBG2V, WTG1V, and WTG2V which satisfy the following relationship between the step (a) and the step (b) so as to cause the states of the first to fourth memory cell (51 to 54) to be the high resistance states;

BL1V=BL2V

WBG1V=WBG2V

WTG1V=WTG2V, and

WTG1V>BL1V>WBG1V where
WTG1V represents a voltage applied to the first top gate word line (WTG1); and
WTG2V represents a voltage applied to the second top gate word line (WTG2).

6. The method according to claim 3, further comprising:
a step (ra) of applying a reading voltage to each bit line (BL), while an OFF voltage is applied to the top gate word line (WTG) connected to the memory cell required to read its state and an ON voltage is applied to the other top gate word lines connected to the other memory cells; and
a step (rd) of determining whether the high resistance state or the low resistance state the memory cell required to read its state has, based on a current value generated in each bit line (BL) in the step (ra).

* * * * *